(12) United States Patent
Min et al.

(10) Patent No.: US 12,250,846 B2
(45) Date of Patent: Mar. 11, 2025

(54) LIGHT EMITTING ELEMENT HAVING LIGHT EMITTING LAYER AND METAL LAYER SEQUENTIALLY STACKED ON CONDUCTIVE BALL, MANUFACTURING METHOD THEREOF, DISPLAY DEVICE INCLUDING LIGHT EMITTING ELEMENT, AND MANUFACTURING METHOD THEREOF

(71) Applicant: LG DISPLAY CO., LTD., Seoul (KR)

(72) Inventors: Kyoungwon Min, Paju-si (KR); Jaekyeong Yun, Paju-si (KR); Sangkyu Kim, Paju-si (KR)

(73) Assignee: LG Display Co., Ltd. (KR)

( * ) Notice: Subject to any disclaimer, the term of this patent is extended or adjusted under 35 U.S.C. 154(b) by 255 days.

(21) Appl. No.: 17/520,921

(22) Filed: Nov. 8, 2021

(65) Prior Publication Data
US 2022/0190302 A1      Jun. 16, 2022

(30) Foreign Application Priority Data

Dec. 14, 2020   (KR) .......................... 10-2020-0174661

(51) Int. Cl.
| | |
|---|---|
| *H10K 50/80* | (2023.01) |
| *H10K 59/12* | (2023.01) |
| *H10K 59/122* | (2023.01) |
| *H10K 71/00* | (2023.01) |
| *H10K 71/13* | (2023.01) |
| *H10K 71/20* | (2023.01) |

(52) U.S. Cl.
CPC ......... *H10K 50/868* (2023.02); *H10K 59/122* (2023.02); *H10K 71/00* (2023.02); *H10K 71/135* (2023.02); *H10K 71/233* (2023.02); *H10K 59/1201* (2023.02)

(58) Field of Classification Search
CPC .... H10K 50/813; H10K 71/135; H10K 71/00; H01L 33/50; H01L 33/505; H01L 25/04
See application file for complete search history.

(56) References Cited

U.S. PATENT DOCUMENTS

| | | | |
|---|---|---|---|
| 2011/0194062 A1* | 8/2011 | Lee ........................ | G02F 1/1339 349/149 |
| 2011/0260955 A1* | 10/2011 | Yoshida ............... | H10K 59/122 345/76 |

(Continued)

FOREIGN PATENT DOCUMENTS

| | | |
|---|---|---|
| KR | 10-2016-0094633 A | 8/2016 |
| KR | 10-2017-0052767 A | 5/2017 |

OTHER PUBLICATIONS

Korean Office Action dated Jun. 4, 2024 issued in Patent Application No. 10-2020-0174661 w/English Translation (15 pages).

*Primary Examiner* — Daniel Whalen
*Assistant Examiner* — Seyon Ali-Simah Punchbeddell
(74) *Attorney, Agent, or Firm* — Fish & Richardson P.C.

(57) ABSTRACT

A light emitting element include: a spherical conductive ball made of a metal material having conductivity; a light emitting layer covering a portion of a surface of the conductive ball; a metal layer formed on the light emitting layer; and an insulating layer covering at least a portion of a remaining portion of the surface of the conductive ball.

10 Claims, 20 Drawing Sheets

(56) References Cited

U.S. PATENT DOCUMENTS

| | | | |
|---|---|---|---|
| 2013/0026476 A1* | 1/2013 | Park | H10K 59/131 |
| | | | 257/40 |
| 2016/0204184 A1* | 7/2016 | Park | H10K 59/88 |
| | | | 257/774 |
| 2017/0104027 A1* | 4/2017 | Lo | H01L 33/005 |
| 2017/0125725 A1* | 5/2017 | Paek | H10K 71/12 |
| 2019/0252636 A1* | 8/2019 | Zhang | H10K 59/38 |
| 2020/0313108 A1* | 10/2020 | Jang | H10K 50/16 |
| 2021/0028385 A1* | 1/2021 | Sakakibara | H10K 59/12 |
| 2022/0416186 A1* | 12/2022 | Takenaka | H05B 33/14 |

* cited by examiner

LIGHT EMITTING ELEMENT HAVING LIGHT EMITTING LAYER AND METAL LAYER SEQUENTIALLY STACKED ON CONDUCTIVE BALL, MANUFACTURING METHOD THEREOF, DISPLAY DEVICE INCLUDING LIGHT EMITTING ELEMENT, AND MANUFACTURING METHOD THEREOF

CROSS-REFERENCE TO RELATED APPLICATION

The present application claims priority to Korean Patent Application No. 10-2020-0174661, filed Dec. 14, 2020, which is hereby incorporated by this reference in its entirety.

BACKGROUND

Field of the Disclosure

The present disclosure relates to a light emitting element, a manufacturing method thereof, a display device including the light emitting element, and a manufacturing method thereof.

Description of the Background

As the information society develops, various types of display devices are being developed. Recently, various display devices such as a liquid crystal display (LCD), a plasma display panel (PDP), and an organic light emitting display (OLED) have been used.

An organic light emitting element constituting the organic light emitting display is self-luminous and does not require a separate light source, so the thickness and weight of the organic light emitting display can be reduced. In addition, the organic light emitting display has high-quality characteristics such as low power consumption, high luminance, and high response speed.

Recently, a technology for forming a light emitting layer of the organic light emitting element through a solution process in which an inkjet device is used is being developed.

SUMMARY

Accordingly, the present disclosure has been made keeping in mind the above problems occurring in the background, and the present disclosure according to aspects is intended to propose a light emitting element having a structure in which a light emitting layer and a cathode electrode are sequentially stacked on the surface of a conductive ball, and a manufacturing method thereof.

In addition, the present disclosure according to the aspects is intended to propose a display device including the light emitting element described above, and a manufacturing method thereof.

In order to achieve the above, a light emitting element according to the aspect includes: a spherical conductive ball made of a metal material having conductivity; a light emitting layer covering a portion of a surface of the conductive ball; a metal layer formed on the light emitting layer; and an insulating layer covering at least a portion of a remaining portion of the surface of the conductive ball.

The conductive ball may have a circular or elliptical cross section.

The conductive ball may be made of at least one of aluminum, copper, and a transparent conductive material, and the metal layer may be made of at least one of the aluminum and the transparent conductive material.

The conductive ball may have any one polarity of a positive polarity and a negative polarity in the one portion thereof and may have another polarity of the positive polarity or the negative polarity in the remaining portion thereof.

The light emitting layer and the metal layer may cover the one portion of the conductive ball, and the insulating layer may cover the remaining portion of the conductive ball by having a shape of a band.

A manufacturing method of the light emitting element according to the aspect includes: forming a base layer at which conductive balls are disposed on a plate; forming an insulating layer on the base layer; forming a light emitting layer and a metal layer on the insulating layer; and separating the conductive balls from each other.

Each of the conductive balls may have a positive polarity in a portion thereof and has a negative polarity in a remaining portion thereof, and the method may further include: controlling a rotation direction of the light emitting element by forming an electric field at a surrounding portion of the plate after the disposing of the conductive balls.

The separating of the conductive balls from each other may include: removing the plate, and removing the base layer, the insulating layer, the light emitting layer, and the metal layer formed between the conductive balls.

The forming of the base layer may include: applying molten polymer resin on the plate; disposing the conductive balls on the polymer resin; and baking the polymer resin.

Patterning the light emitting layer and the metal layer may include: applying a photoresist on the insulating layer; exposing a portion of the photoresist to light by emitting the light on a lower portion of the plate; etching a remaining portion of the photoresist which is not exposed to the light and a portion of the insulating layer formed on an upper surface of each of the conductive balls; and forming the light emitting layer and the metal layer on the insulating layer and the upper surface of the conductive ball exposed to the etching.

The display device according to the aspect includes: a substrate on which a circuit element layer comprising at least one circuit element is disposed; an anode electrode formed on the circuit element layer; a bank configured to cover an edge of the anode electrode and to define a light emitting part; at least one light emitting element disposed on the anode electrode by corresponding to the light emitting part; and a cathode electrode covering the at least one light emitting element and the bank, wherein the light emitting element may include: a spherical conductive ball made of a metal material having conductivity; a light emitting layer covering a portion of a surface of the conductive ball; a metal layer formed on the light emitting layer; and an insulating layer covering at least a portion of a remaining portion of the surface of the conductive ball.

The conductive ball may have a circular or elliptical cross section.

The light emitting part may have a shape in which one or more circles or ellipses are disposed adjacently to each other, the circle or ellipse corresponding to shape and diameter of the light emitting element.

The anode electrode may include at least one protruding part corresponding the at least one light emitting element.

The bank may divide the light emitting part into a plurality of sections, and the display device may further include an auxiliary bank disposed between each of the light emitting elements.

A manufacturing method of a display device according to the aspect includes: forming a circuit element layer comprising at least one circuit element on a substrate; forming an anode electrode on the circuit element layer; forming a bank covering an edge of the anode electrode and defining a light emitting part; applying adhesive on the anode electrode; disposing at least one light emitting element on the anode electrode by corresponding to the light emitting part; and forming a cathode electrode covering the at least one light emitting element and the bank, wherein the light emitting element may include: a spherical conductive ball made of a metal material having conductivity; a light emitting layer covering a portion of a surface of the conductive ball; a metal layer formed on the light emitting layer; and an insulating layer covering at least a portion of a remaining portion of the surface of the conductive ball.

The disposing of the at least one light emitting element may include: applying a solution into the light emitting part, the at least one light emitting element being immersed in a solvent contained in the solution, and drying the solution.

The conductive ball may have any one polarity of a positive polarity and a negative polarity in a portion of the conductive ball covered by the light emitting layer and the metal layer, and may have another polarity of the positive polarity and the negative polarity in a remaining portion of the conductive ball, and the method may further include: controlling a rotation direction of the at least one light emitting element by forming an electric field at a surrounding portion of the substrate after the applying of the solution into the light emitting part.

The method may further include: forming a buffer layer covering the at least one light emitting element and the bank before the forming of the cathode electrode when the rotation direction of the light emitting element is controlled such that the one portion of the conductive ball faces the substrate.

The applying of the adhesive may include applying a mixed solution of the adhesive and a solvent with each other on the anode electrode, and the disposing of the at least one light emitting element may include jetting the at least one light emitting element into the light emitting part by using an inkjet device.

In the light emitting element according to the aspects, characteristics of the light emitting element are maintained in the display device manufactured in a solution process, thereby increasing the lifespan and light emission efficiency of the display device and reducing power consumption thereof.

In addition, in the light emitting element according to the aspects, luminescence properties can be prevented from being deteriorated due to a pile-up phenomenon occurring during the drying of solution when forming the light emitting layer of a light emitting diode in a solution process.

Furthermore, in the display device and the manufacturing method thereof according to the aspects, a mask for the light emitting layer of the light emitting diode and cathode deposition is not used, thereby making the manufacturing method simple and easy.

BRIEF DESCRIPTION OF THE DRAWINGS

The above and other features and advantages of the present disclosure will be more clearly understood from the following detailed description when taken in conjunction with the accompanying drawings, in which.

DETAILED DESCRIPTION

Figure 1:
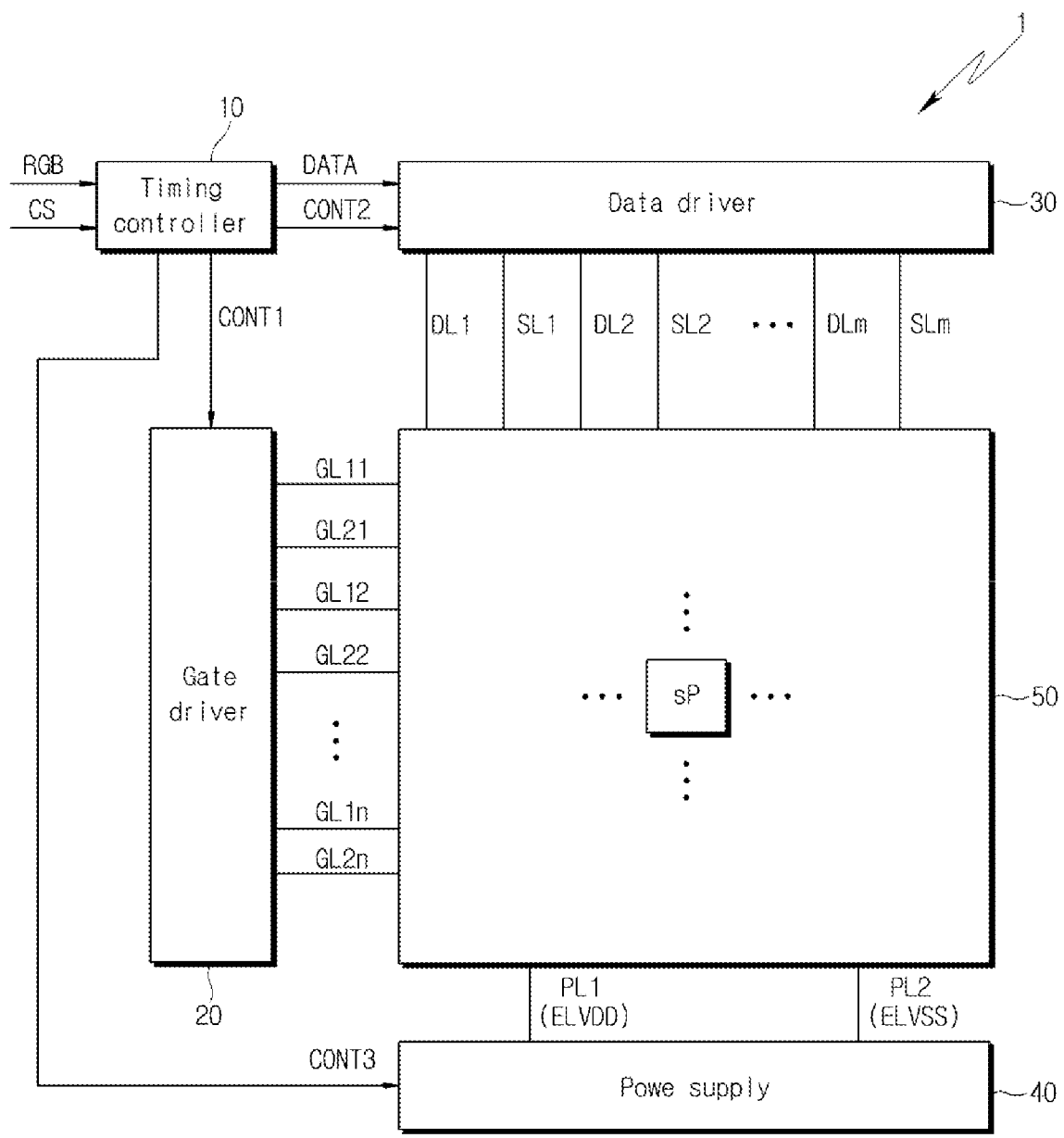
FIG. 1 is a block diagram illustrating the configuration of a display device according to an aspect.

Hereinafter, aspects of the present disclosure will be described with reference to the accompanying drawings. In this specification, when a component (or an area, layer, or portion, etc.) is referred to as being "on", "connected to", or "coupled to" another component, it means that the component can be directly connected/coupled to other components or that a third component can be disposed therebetween.

Like reference numerals refer to like elements. In addition, in the drawings, the thicknesses, proportions, and dimensions of components are exaggerated for effective description of technical content. "And/or" includes any combination of one or more that the associated configurations may define.

Terms such as first and second, etc. may be used to describe various elements, but the elements are not limited to the terms. The above terms are used only for the purpose of distinguishing one component from another component. For example, without departing from the scope of the present disclosure, the first component may be referred to as the second component. Similarly, the second component may also be referred to as the first component. A singular expression includes a plural expression unless the context clearly dictates otherwise.

Terms such as "under", "at a lower side", "on", "at an upper side" are used to describe the relationship of the components shown in the drawings. The above terms have relative concepts and are described with reference to directions indicated in the drawings.

Terms such as "comprise" or "have" are intended to designate that a feature, number, step, operation, component, or combination thereof described in the specification is present, and it should be understood that the terms do not preclude the possibility of addition or existence of one or more other features or numbers, steps, operations, components, or combinations thereof.

FIG. 1 is a block diagram illustrating the configuration of a display device according to an aspect.

Referring to FIG. 1, the display device 1 includes a timing controller 10, a gate driver 20, a data driver 30, a power supplier 40, and a display panel 50.

The timing controller 10 can receive an image signal RGB and a control signal CS from the outside. The image signal RGB may include a plurality of gradation data. The control signal CS, for example, may include a horizontal sync signal, a vertical sync signal, and a main clock signal.

The timing controller 10 processes the image signal RGB and the control signal CS such that the image signal RGB and the control signal CS suit the operation condition of the display panel 50 and can generate and output image data, a gate drive control signal CONT1, a data drive control signal CONT2, and a power supply control signal CONT3.

The gate driver 20 can be connected with pixels PX of the display panel 50 through a plurality of first gate lines GL11 to GL1n. The gate driver 20 can generate gate signals on the basis of the gate drive control signal CONT1 output from the timing controller 10. The gate driver 20 can provide the generated gate signals to the pixels PX through the plurality of first gate lines GL11 to GL1n.

In various aspects, the gate driver 20 may further be connected with the pixels PX of the display panel 50 through a plurality of second gate lines GL21 to GL2n. The gate driver 20 can provide a sensing signal to the pixels PX through the plurality of second gate lines GL21 to GL2n. The sensing signal may be provided to the pixels so as to measure the characteristics of a drive transistor and/or a light emitting diode provided inside the pixels PX.

The data driver 30 may be connected with the pixels PX of the display panel 50 through a plurality of data lines DL1 to DLm. The data driver 30 can generate data signals on the basis of the image data and the data drive control signal CONT2 output from the timing controller 10. The data driver 30 can provide the generated data signals to the pixels PX through the plurality of data lines DL1 to DLm.

In various aspects, the data driver 30 may further be connected with the pixels PX of the display panel 50 through the plurality of sensing lines SL1 to SLm (or, reference lines). The data driver 30 may provide a reference voltage (or, a sensing voltage or an initialized voltage) to the pixels PX through the plurality of sensing lines SL1 to SLm, or may detect the state of each of the pixels PX on the basis of an electrical signal fed back from the pixels PX.

The power supplier 40 may be connected with the pixels PX of the display panel 50 through a plurality of power lines PL1 and PL2. The power supplier 40 may generate a drive voltage to be provided to the display panel 50 on the basis of the power supply control signal CONT3. For example, the drive voltage may include a high potential drive voltage ELVDD and a low potential drive voltage ELVSS. The power supplier 40 may provide the generated drive voltages ELVDD and ELVSS to the pixels PX through the power lines PL1 and PL2 corresponding to the power supplier 40.

A plurality of pixels PX (or referred to as sub-pixels) is arranged in the display panel 50. For example, the pixels PX may be arranged in a matrix form on the display panel 50.

Each of the pixels PX may be electrically connected to the gate line and the data line which correspond thereto. Such a pixel PX can emit light with luminance corresponding to gate signals and data signals supplied through the first gate lines GL11 to GL1n and the data lines DL1 to DLm, respectively.

Each of the pixels PX may display any one of the first to third colors. In the aspect, each of the pixels PX may display any one of red, green, and blue colors. In another aspect, each of the pixels PX may display any one of cyan, magenta, and yellow colors. In various aspects, the pixels PX may be configured to display any one of four or more colors. For example, each of the pixels PX may display any one of red, green, blue, and white colors.

The timing controller 10, the gate driver 20, the data driver 30, and the power supplier 40 may be configured as individual integrated circuits (IC), respectively, or may be configured as integrated circuits having at least some of the timing controller 10, the gate driver 20, the data driver 30, and the power supplier 40 integrated with each other. For example, at least one of the data driver 30 and the power supplier 40 may be configured as an integrated circuit integrated with the timing controller 10.

In addition, in FIG. 1, the gate driver 20 and the data driver 30 are illustrated as components separate from the display panel 50, but at least one of the gate driver 20 and the data driver 30 may be configured to be integrated with the display panel 50 according to an in panel type. For example, the gate driver 20 may be configured to be integrated with the display panel 50 according to a gate in panel (GIP).

Figure 2:
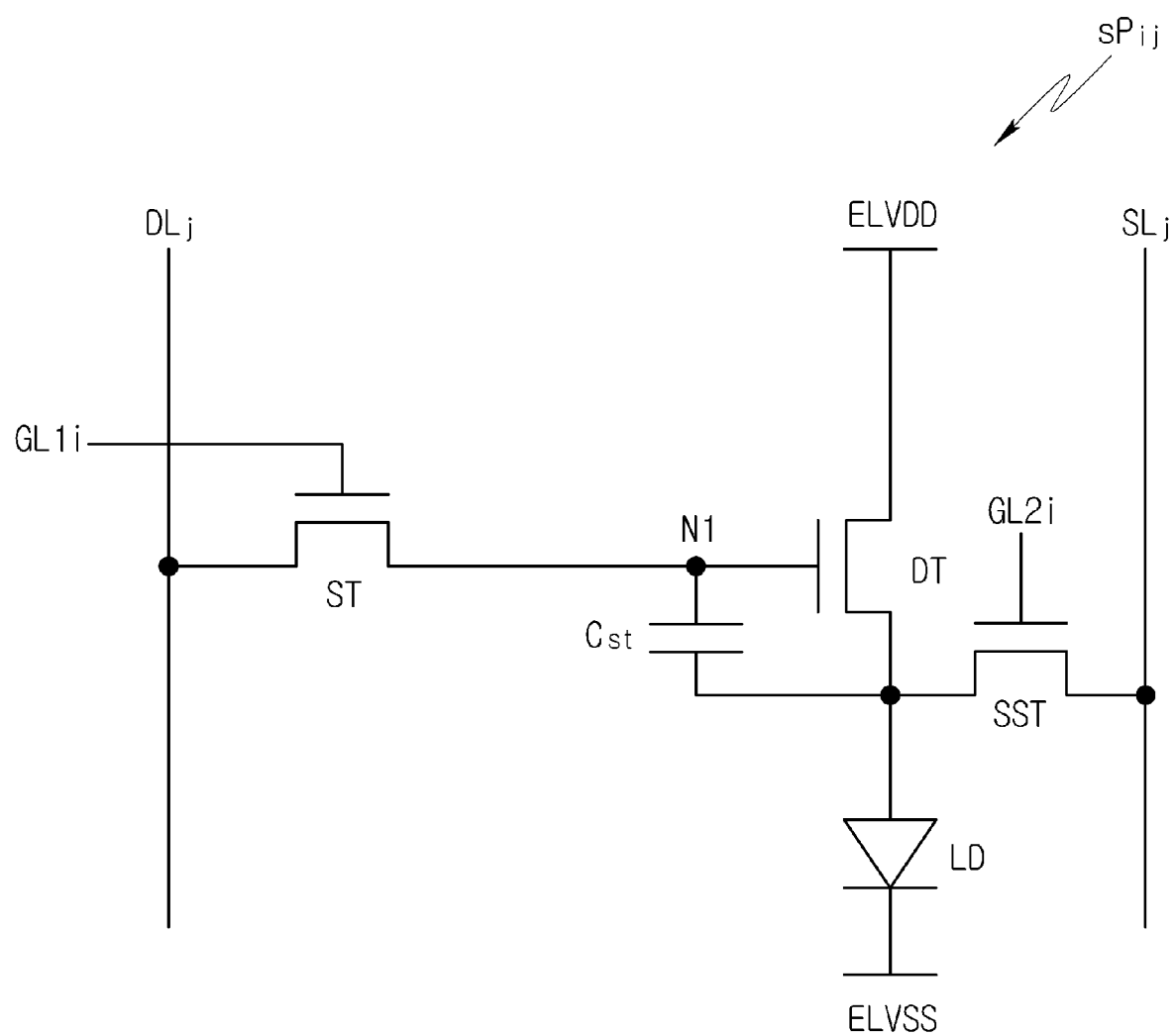
FIG. 2 is a circuit diagram of a pixel according to the aspect.

FIG. 2 is a circuit diagram of a pixel illustrated in FIG. 1 according to the aspect. FIG. 2 illustrates the PXij connected to an $i^{th}$ first gate line GL1i and a $i^{th}$ data line DLj.

Referring to FIG. 2, the pixel PX includes a switching transistor ST, a drive transistor DT, a sensing transistor SST, a storage capacitor Cst, and a light emitting diode LD.

The first electrode (for example, a source electrode) of the switching transistor ST is electrically connected with a $j^{th}$ data line DLj, and the second electrode thereof (for example, a drain electrode) is electrically connected with a first node N1. The gate electrode of the switching transistor ST is electrically connected with the $i^{th}$ first gate line GL1i. When the gate signal of a gate on level is applied to the $i^{th}$ first gate line GL1i, the switching transistor ST is turned on and transmits a data signal applied to the $j^{th}$ data line DLj to the first node N1.

The first electrode of the storage capacitor Cst is electrically connected with the first node N1, and the second electrode thereof is connected to the first electrode of the light emitting diode LD. The storage capacitor Cst can charge a voltage corresponding to difference between a voltage applied to the first node N1 and a voltage applied to the first electrode of the light emitting diode LD.

The first electrode (for example, a source electrode) of the drive transistor DT is configured to receive the high potential drive voltage ELVDD, and the second electrode thereof (for example, a drain electrode) is electrically connected to the first electrode (for example, an anode electrode) of the light emitting diode LD. The gate electrode of the drive transistor DT is electrically connected to the first node N1. The drive transistor DT is turned on when the voltage of the gate on level is applied to the gate electrode through the first node N1 and can control the amount of drive current flowing through the light emitting diode LD in response to the voltage supplied to the gate electrode.

The first electrode (for example, the source electrode) of the sensing transistor SST is electrically connected with a $j^{th}$ sensing line SLj, and the second electrode thereof (for example, the drain electrode) is electrically connected to the first electrode (for example, an anode electrode) of the light emitting diode LD. The gate electrode of the sensing transistor SST is electrically connected to the $i^{th}$ second gate line GL2i. When the sensing signal of the gate on level is applied to the $i^{th}$ second gate line GL2i, the sensing transistor SST is turned on and transmits the reference voltage applied to the $j^{th}$ sensing line SLj to the first electrode of the light emitting diode LD.

The light emitting diode LD outputs light corresponding to the drive current. The light emitting diode LD can output light corresponding to any one color of red, green, blue, and white colors. The light emitting diode LD may be an organic light emitting diode (OLED) or a micro inorganic light emitting diode having a size ranging from micro to nano scale, but is not limited thereto in the aspect of the present disclosure. Hereinafter, the technical idea of the aspect of the present disclosure will be described with reference to the aspect in which the light emitting diode LD is configured as the organic light emitting diode.

In the aspect of the present disclosure, the structure of the pixel PXij is not limited to the structure illustrated in FIG. 2. According to the aspect, the pixel PXij may further include at least one element so as to compensate for the threshold voltage of the drive transistor DT, or so as to initialize the voltage of the gate electrode of the drive transistor DT and/or the voltage of the first electrode of the light emitting diode LD.

In FIG. 2, the switching transistor ST, the drive transistor DT, and the sensing transistor SST are illustrated as an NMOS transistor, but the display device of the present disclosure is not limited thereto. For example, at least some or all of transistors constituting each of the pixels PX may be configured as a PMOS transistor. In various aspects, each of the switching transistor ST, the drive transistor DT, and the sensing transistor SST may be configured as a low temperature poly silicon (LTPS) thin film transistor, an oxide thin film transistor, or a low temperature polycrystalline oxide (LTPO) thin film transistor.

Figure 3:
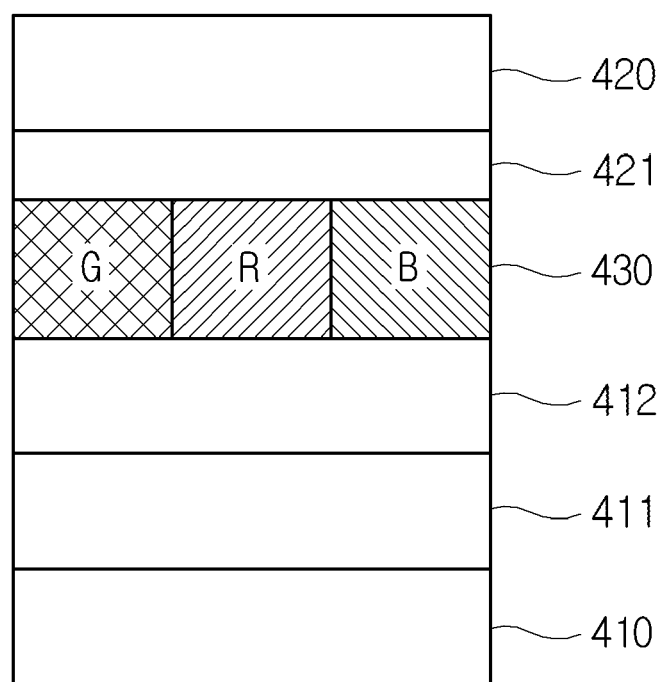
FIG. 3 is a view roughly illustrating the structure of a light emitting diode according to the aspect.

FIG. 3 is a view roughly illustrating the structure of the light emitting diode according to the aspect.

Referring to FIG. 3, the light emitting diode LD according to the aspect may include an anode electrode 410, a cathode electrode 420, and a light emitting layer 430 placed between the anode electrode 410 and the cathode electrode 420.

The anode electrode 410 may be made of a transparent conductive material such as indium tin oxide (ITO), indium zinc oxide (IZO), or zinc oxide (ZnO). When the anode electrode 410 is a reflective electrode, the anode electrode 410 may include a reflective layer. The reflective layer may be made of a metallic material such as aluminum (Al), copper (Cu), silver (Ag), nickel (Ni) or an alloy thereof. In the aspect, the reflective layer may be made of silver, palladium, or a copper alloy (APC).

The anode electrode 410 may be configured as a triple layer including a transparent conductive layer/a reflective layer/a transparent conductive layer. For example, the anode electrode 410 may be configured as a triple layer including ITO/Ag/ITO.

The cathode electrode 420 may be formed of a transparent conductive material (TCO) which can transmit light therethrough or a semi-transmissive conductive material such as molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. When the cathode electrode 420 is formed of the semi-transmissive conductive material, the light output efficiency of the cathode electrode may be increased due to a micro cavity thereof.

The light emitting layer 430 as an organic light emitting layer may be formed of an organic material including a phosphorescent or fluorescent material. The color generated by the light emitting layer 430 may be one of red, green, and blue colors, but the present disclosure is not limited thereto. For example, the color of light generated by the light emitting layer 430 may be one of magenta, cyan, yellow colors.

In the aspect, a hole transport layer 412 and a hole injection layer 411 may be disposed between the light emitting layer 430 and the anode electrode 410. The hole transport layer 412 and the hole injection layer 411 function to efficiently transmit holes injected from the anode electrode 410 to the light emitting layer 430.

An electron injection layer 421 may be disposed between the cathode electrode 420 and the light emitting layer 430. The electron injection layer 421 functions to efficiently transmit an electron injected from the cathode electrode 420 to the light emitting layer 430.

In the aspect, the light emitting diode LD may be formed by a solution process using an inkjet device. Hereinafter, a method of forming the light emitting diode will be described.

Figure 4:
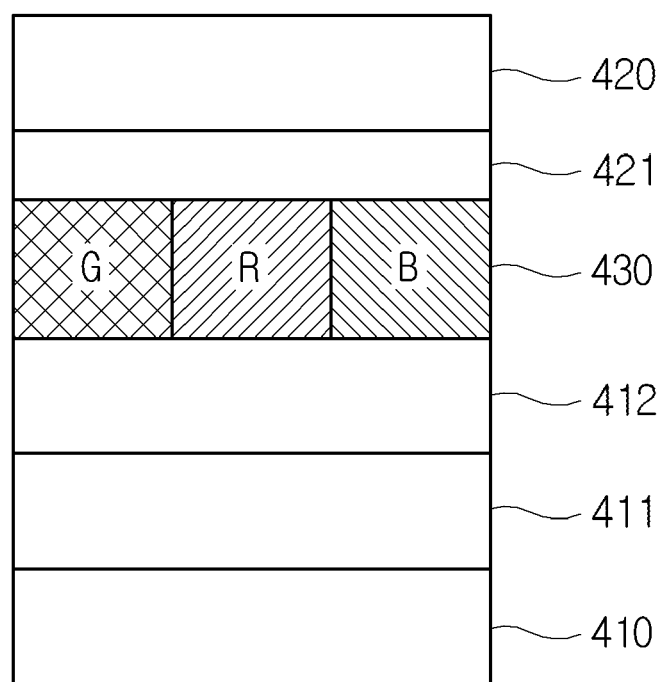
FIG. 4 is a view illustrating the forming method of the light emitting diode according to the aspect.

FIG. 4 is a view illustrating the forming method of the light emitting diode according to the aspect.

Referring to FIGS. 3 and 4, a bank 500 may be formed on a substrate 200. The bank 500 may be a defining layer defining a light emitting part of the pixel PX. In the aspect, at least two-layered banks having hydrophilicity and/or hydrophobicity may be formed. For example, the bank 500 may have a shape in which a first bank having hydrophilicity and a second bank having hydrophobicity are stacked on each other.

In the aspect, the anode electrode 410 may be patterned on the substrate 200 before the bank 500 is formed. In such an aspect, the bank 500 may be disposed to cover a portion of the edge of the anode electrode 410 so as to define the light emitting part.

Next, solution for forming the light emitting layer 430 may be applied into the light emitting part. The solution may be manufactured by mixing solvent with an organic material constituting the light emitting layer 430. The solution may be jetted into the light emitting part by the inkjet device provided with an inkjet head in which a nozzle is formed. The solution applied to the light emitting part is dried and thus the light emitting layer 430 is formed.

In various aspects, after the bank 500 is formed, the solution for sequentially forming the hole injection layer 411, the hole transport layer 412, the light emitting layer 430, and the electron injection layer 421 may be jetted and dried.

The cathode electrode 420 may be widely formed on the light emitting layer 430 and the bank 500. In the light emitting layer, the anode electrode 410, the light emitting layer 430, and the cathode electrode 420 are stacked to be in direct contact with each other.

As described above, when the light emitting diode LD is formed through the solution process, the solvent is mixed with an organic material, and the characteristics of the organic material may be deteriorated, so the lifespan and light emission efficiency of the light emitting diode LD may be deteriorated.

To solve this problem, the light emitting element having a structure in which the light emitting layer is applied on the surface of a conductive ball may be provided. Hereinafter, the structure of the light emitting element according to the aspect will be described in detail.

Figure 5:
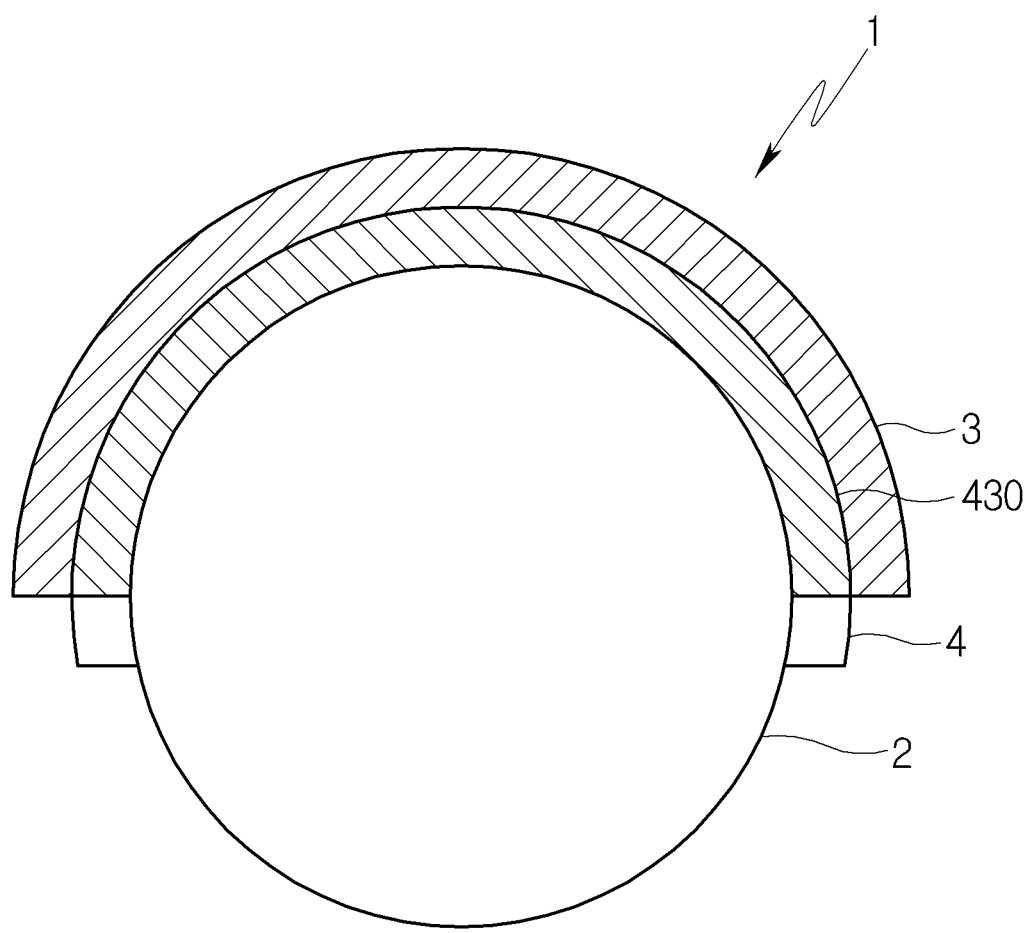
FIG. 5 is a view illustrating the structure of a light emitting element according to the aspect.

FIG. 5 is a view illustrating the structure of the light emitting element according to the aspect.

Referring to FIG. 5, the light emitting element 1 according to the aspect may include a conductive ball 2, a light emitting layer 430 stacked on the surface of the conductive ball 2, and a metal layer 3.

The conductive ball 2 may have the shape of a sphere (or a circular sphere) having a circular cross section or the shape of an elliptical sphere having an elliptical cross section. However, the shape of the conductive ball 2 is not limited thereto.

The conductive ball 2 may be a micro ball having a diameter of several micrometers (µm). The diameter of the conductive ball 2 may be determined by corresponding to the area of the light emitting part described with reference to FIG. 4. For example, the diameter of the conductive ball 2 may be about half the width of the light emitting part.

In the aspect, the conductive ball 2 may be formed of a metal material having high conductivity. For example, the conductive ball 2 may be formed of aluminum, which is advantageous for improving reflectance, copper, which is advantageous for conductivity improvement and a manufacturing process, or a transparent conductive material such as ITO or IZO. However, a material of which the conductive ball 2 is formed is not limited thereto. In various aspects, the conductive ball 2 may be manufactured by coating a ball made of glass with the above-mentioned metal material.

In the aspect, a magnetic material may be included in the conductive ball 2. For example, a magnetic material or a polarizing material affected by magnetic force may be applied inside the conductive ball 2. Accordingly, the conductive ball 2 may be configured to have a positive polarity in at least one portion thereof and to have a negative polarity in the remaining portion.

A part of the surface of the conductive ball 2 may be covered by the light emitting layer 430. For example, the light emitting layer 430 may be configured to cover about half of the surface of the conductive ball 2. However, the present aspect is not limited thereto.

The metal layer 3 may be formed on the light emitting layer 430. For example, the metal layer 3 may be made of a transparent conductive material such as ITO or of metal such as aluminum. The metal layer 3 may cover the entire surface of the light emitting layer 430 or at least a portion thereof.

In the aspect, at least a portion of the remaining portion of the surface of the conductive ball 2 may be covered by an insulating layer 4. For example, the insulating layer 4 may cover at least a portion of the remaining portion which is not covered by the light emitting layer 430 by having a shape of a band. The insulating layer 4 may be configured as an oxide layer, but is not limited thereto.

Hereinafter, the method of manufacturing the light emitting element 1 having the above shape will be described in detail.

FIGS. 6A to 6I are views illustrating the manufacturing method of the light emitting element according to the aspect.

Figure 6A:
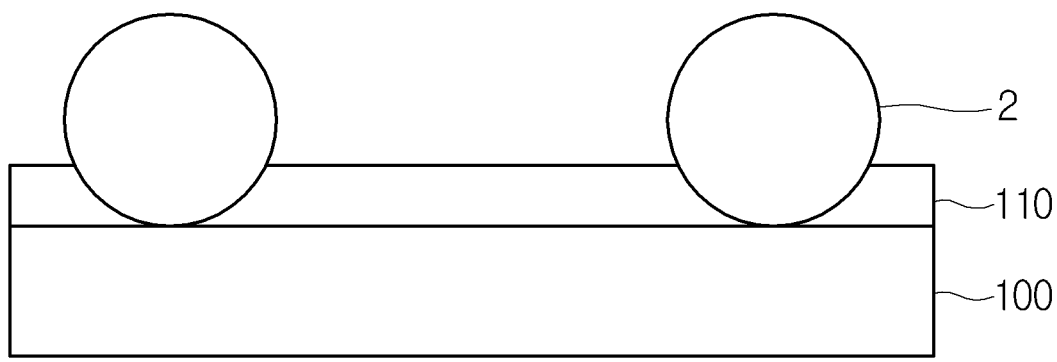
FIGS. 6A to 6I are views illustrating a manufacturing method of the light emitting element according to the aspect.

First, referring to FIG. 6A, molten polymer resin may be applied on a plate 100. For example, the polymer resin may include polyimide. In addition, conductive balls 2 are disposed on the polymer resin. Next, as illustrated in FIG. 6A, when the polymer resin is baked, a base layer 110 having a shape in which the conductive balls 2 are partially depressed in the polymer resin may be formed.

Figure 6B:
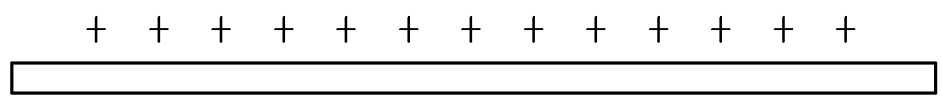
Figure 6B:
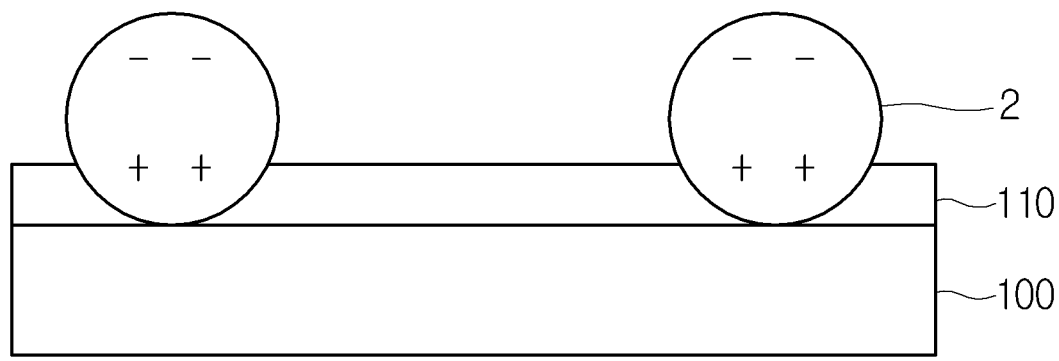
Figure 6B:
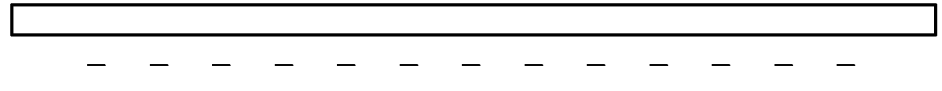

As illustrated in FIG. 6B, when each of the conductive balls 2 is disposed on the polymer resin, the rotation direction of the conductive ball 2 may be controlled. For example, in a case in which the conductive ball 2 includes a magnetic material, an electric field may be formed at the surrounding area of the plate 100 on which the conductive ball 2 is disposed. In this case, the conductive ball 2 may stand in a direction corresponding to the electric field. For example, when an electrode of a positive electric field is disposed on the upper side of the plate 100 and an electrode of a negative electric field is disposed on the lower side of the plate 100, the conductive ball 2 may be rotated such that the conductive ball 2 has a portion of a negative polarity located at the upper portion thereof and has a portion of a positive polarity located at the lower portion thereof. According to the rotated state of the conductive ball 2, the direction of the light emission of the light emitting element 1 may be determined.

Figure 6C:
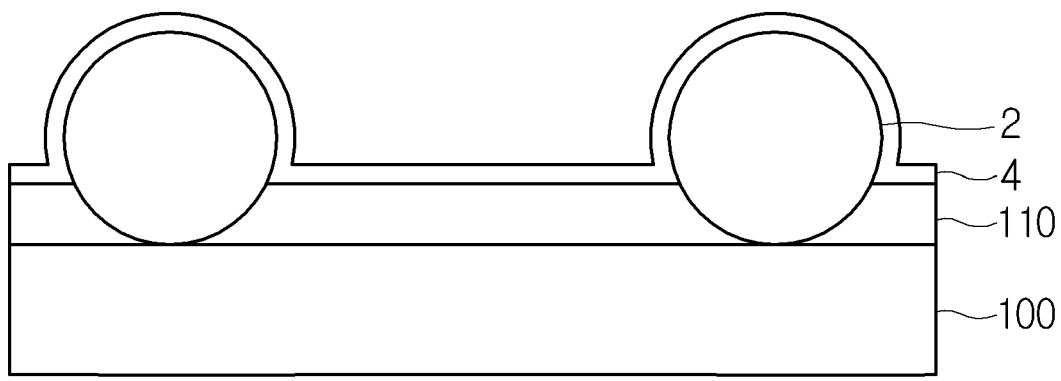

Next, as illustrated in FIG. 6C, the insulating layer 4 is formed on the plate 100. The insulating layer 4 may cover the surface of the base layer 110 and the surfaces of the conductive balls 2 which are not depressed into the base layer 110. In the aspect, the insulating layer 4 may be formed on the plate 100 through chemical vapor deposition (CVD). Such an insulating layer 4 may prevent a short circuit between the metal layer 3 and a conductive layer disposed on the display panel 50 when the light emitting element 1 is mounted on the display panel 50.

Next, the light emitting layer 430 and the metal layer 3 may be formed on the conductive ball 2. To this end, first, a photoresist may be patterned on the plate 100.

Figure 6D:
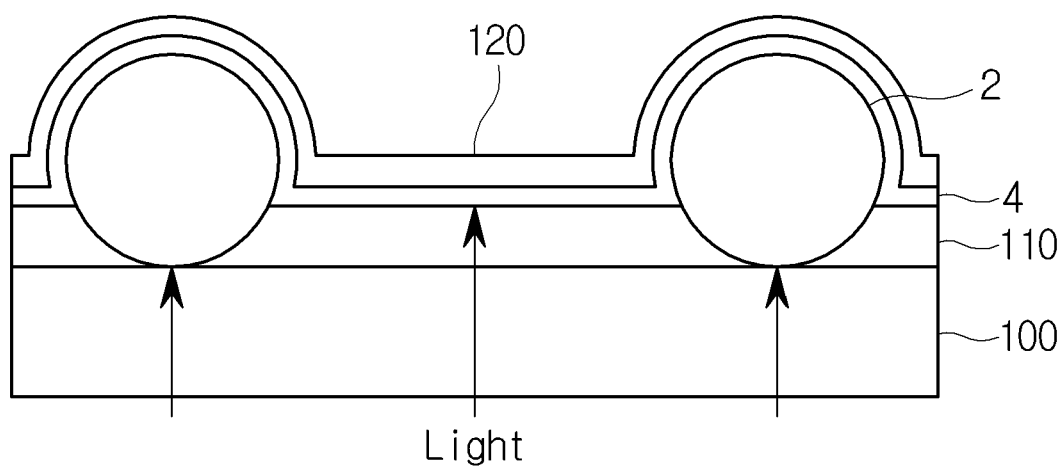

Specifically, as illustrated in FIG. 6D, the photoresist (PR) is applied on the entire surface of the plate 100, and baking and cleaning (rinsing) processes thereof are performed to form a photoresist layer 120. When light is emitted to the lower part of the plate 100, in a part at which the conductive ball 2 is disposed, the light may be reflected, and in a part at which the conductive ball 2 is not disposed, the light may reach the photoresist layer 120.

Figure 6E:
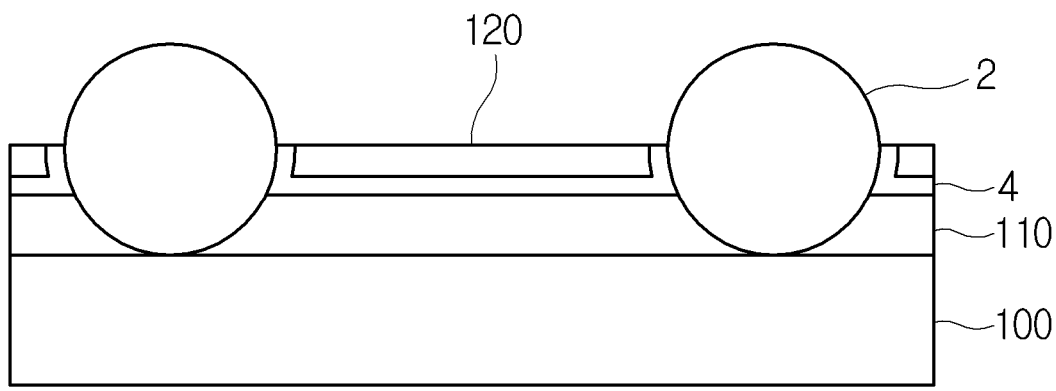

As illustrated in FIG. 6E, a photoresist which is not exposed to light may be removed through an oxide etching process. After a remaining photoresist which is not exposed to the light is removed, the photoresist layer 120 may be disposed only between the conductive balls 2.

While the photoresist is being removed, a part of the insulating layer 4 may be removed together with the photoresist. For example, in the remaining portion except for a portion covered by the photoresist exposed to light and a portion adjacent to the photoresist exposed to the light, the insulating layer 4 may be removed. In this case, the insulating layer 4 is patterned to surround the circumference of the conductive ball 2 by having a shape of a band.

Figure 6F:
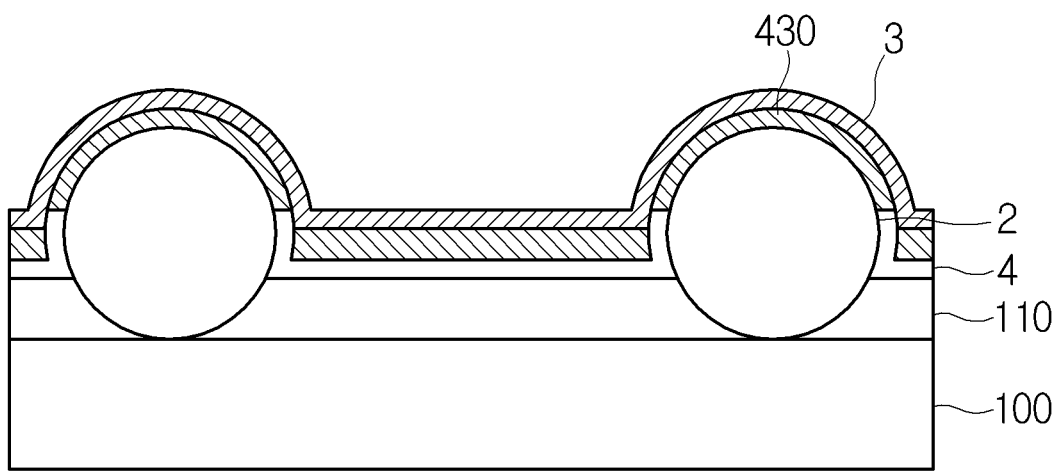

Next, as illustrated in FIG. 6F, the light emitting layer 430 and the metal layer 3 may be formed on the entire surface of the plate 100. The light emitting layer 430 may be formed through an e-beam evaporation process. In this case, due to a step coverage characteristic of the light emitting layer, the light emitting layer 430 may be cut off at both sides of the conductive ball 2, and the metal layer 3 may be continuously formed.

Figure 6G:
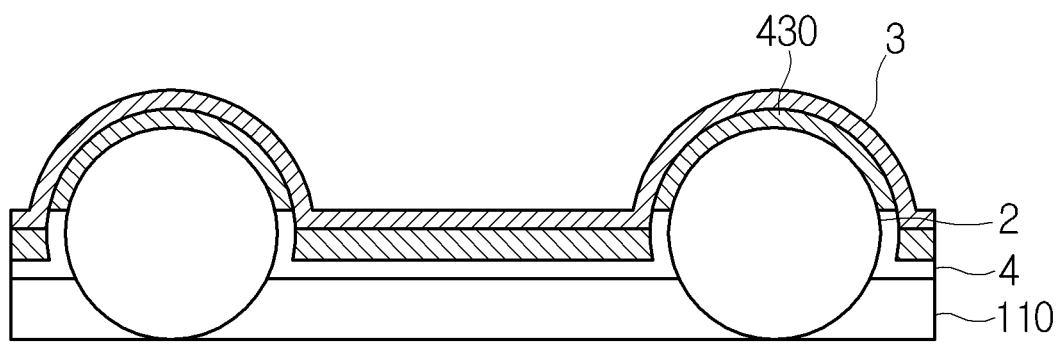
Figure 6H:
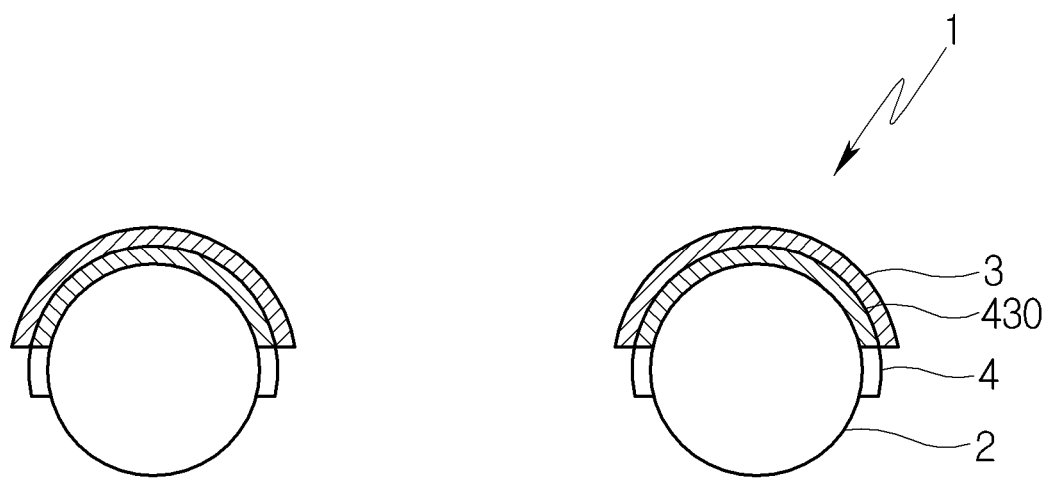

Next, the conductive balls may be separated from each other. To this end, first, as illustrated in FIG. 6G, the plate 100 may be removed. In addition, as illustrated in FIG. 6H, the base layer 110, the insulating layer 4, the light emitting layer 430, and the metal layer 3 which are formed between the conductive balls 2 are removed to separate the conductive balls 2 from each other. In the aspect, the light emitting layer 430 formed between the conductive balls 2 may be removed through the oxide etching process, and the remaining materials may be removed through a ball-mill method.

As illustrated in FIG. 6H, after the remaining materials are removed, the light emitting element 1 may be manufactured in such a manner that the light emitting layer 430 and the metal layer 3 are stacked on a surface of the conductive ball 2 and the insulating layer 4 is formed on a portion of the remaining surface of the conductive ball 2.

The conductive ball 2 of the light emitting element 1 may have the portion of a positive polarity or the portion of a negative polarity covered by the light emitting layer 430 and the metal layer 3 according to the rotated direction of the conductive ball 2. In the illustrated aspect, as illustrated in FIG. 6B, when the portion of a negative polarity is disposed on the upper part of the conductive ball 2, the portion of a negative polarity may be covered by the light emitting layer 430 and the metal layer 3. In such an aspect, the insulating layer 4 may be configured to cover a part of the portion of a positive polarity. However, the aspect of the present disclosure is not limited thereto.

Figure 6I:
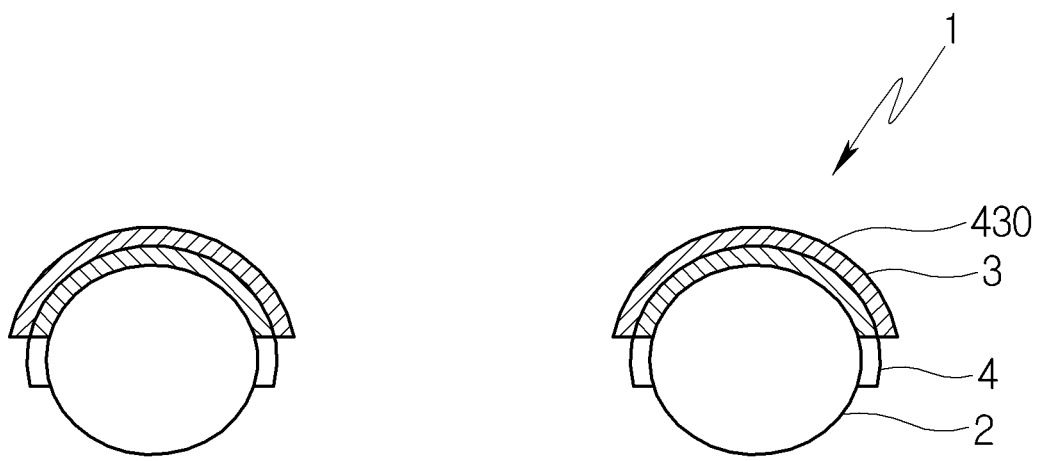

In the aspect of FIGS. 6A to 6H, the conductive ball 2 is spherical, but the present aspect is not limited thereto. That is, in another aspect, the conductive ball 2 may be elliptical as illustrated in FIG. 6I.

In various aspects, the display panel 50 can be manufactured by using the conductive ball 2 manufactured as described above. Hereinafter, the manufacturing method of the display panel 50 will be described in more detail.

FIGS. 7A to 7G are views illustrating the manufacturing method of the display device according to the aspect.

Figure 7A:
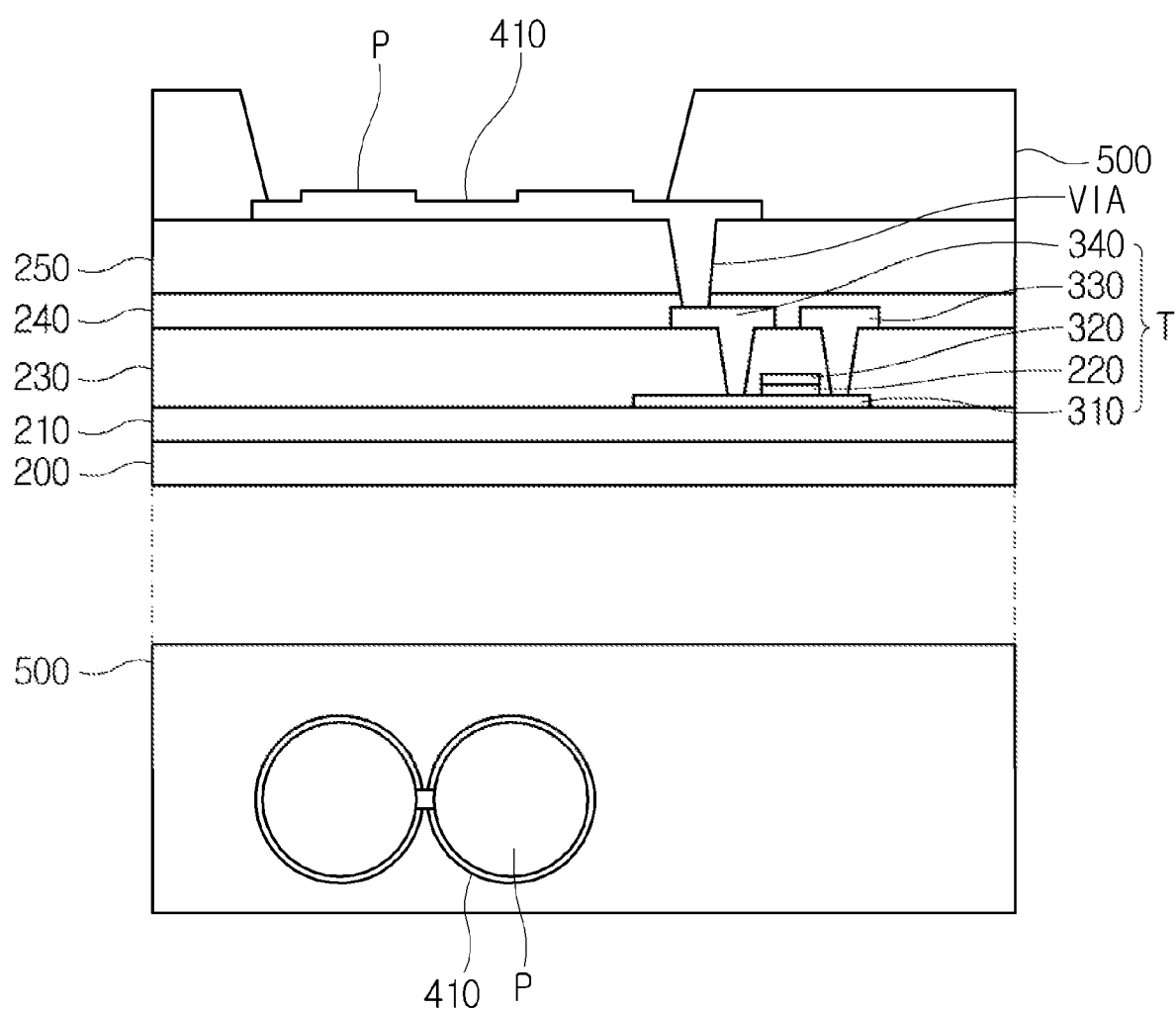
FIGS. 7A to 7G are views illustrating a manufacturing method of the display device according to the aspect.

The drawing illustrated at the upper end of FIG. 7A is a sectional view of a portion of the display panel 50, and the drawing illustrated at the lower end of FIG. 7A is a top plan view of a portion corresponding to the sectional view. Referring to FIG. 7A, a back plate on which at least one circuit element for driving the light emitting diode LD is disposed may be provided on the substrate 200. For example, the back plate is disposed on the substrate 200 and may include a circuit element layer at which at least one circuit element is disposed.

The substrate 200 as a base of the display panel 50 may be a substrate which passes light therethrough. The substrate 200 may be a rigid substrate including glass or tempered glass or may be a flexible substrate made of plastic.

The circuit element layer is formed on the substrate 200 and may include circuit elements (for example, a transistor and a capacitor, etc.) and wires constituting the pixel PX.

First, a buffer layer 210 may be formed on the substrate 200. The buffer layer 210 prevents the diffusion of ions or impurities from the substrate 200 and can block moisture penetration.

An active layer 310 may be formed on the buffer layer 210. The active layer 310 may be formed of a silicon-based semiconductor material or an oxide-based semiconductor material. Such an active layer 310 may include a source part including p-type impurities, a drain part including n-type impurities, and a channel part formed between the source part and the drain part.

A gate insulating layer 220 may be formed on the active layer 310. The gate insulating layer 220 may be formed on the channel part of the active layer 310. The gate insulating layer 220 may be silicon oxide (SiOx) layer, silicon nitride (SiNx) layer, or a multilayer thereof.

The gate electrode 320 may be formed on the gate insulating layer 220. The gate electrode 320 may be disposed at a position corresponding to the channel part of the active layer 310.

An interlayer insulating layer 230 may be formed on the gate electrode 320. The interlayer insulating layer 230 may cover the gate electrode 320, portions of the active layer 310 which are not covered by the gate electrode 320, and portions of the buffer layer 210 on which the active layer 310 is not formed. The interlayer insulating layer 230 may be a silicon oxide (SiOx) layer, a silicon nitride (SiNx) layer, or a multilayer thereof.

A source electrode 330 and a drain electrode 340 may be formed on the interlayer insulating layer 230. The source electrode 330 and the drain electrode 340 may be connected with the source part and drain part of the active layer 310, respectively, through contact holes formed through the interlayer insulating layer 230.

The gate electrode 320, the source electrode 330, the drain electrode 340, and the active layer 310 corresponding thereto may constitute a transistor T. For example, the transistor T may be a drive transistor DT or a switching transistor ST. In FIG. 7A, the drive transistor DT in which the drain electrode 340 is connected with the anode electrode 410 of the light emitting diode LD is illustrated as an example.

A passivation layer 240 may cover the source electrode 330 and the drain electrode 340 formed on the interlayer insulating layer 230. The passivation layer 240 is an insulating layer for protecting lower elements and may be formed of an inorganic material or an organic material.

An overcoat layer 250 may be formed on the passivation layer 240. The overcoat layer 250 may be a planarization layerfilm configured to alleviate the step of a lower structure. The overcoat layer 250 may be made of an organic material such as polyimide, benzocyclobutene series resin, or acrylate.

A light emitting diode layer may be formed on the back plate. The light emitting diode layer is formed on the overcoat layer 250 and includes light emitting diodes LD. The light emitting diode LD includes the anode electrode 410, and the light emitting element 1 and the cathode electrode 420 to be described later.

The anode electrode 410 is formed on the overcoat layer 250. The anode electrode 410 is connected with the drain electrode 340 of the transistor T through a hole VIA formed through the overcoat layer 250 and the passivation layer 240. When the anode electrode 410 includes the reflective layer, the anode electrode 410 may be configured as a triple layer including the transparent conductive layer/the reflective layer/the transparent conductive layer. For example, the anode electrode 410 may be configured as a triple layer including ITO/Ag/ITO.

In the aspect, the anode electrode 410 may be patterned to have one or more protruding parts P. Each of protruding parts P has a shape corresponding to the light emitting element 1, and, for example, may have a circular or elliptical shape. In addition, the size of the protruding part P may correspond to the size of the light emitting element 1. In such an aspect, the circular or elliptical shape of the protruding part P may correspond to one light emitting element 1. Accordingly, the number of the protruding parts P is not limited to the number of the protruding parts P illustrated in the aspect of the present disclosure, and the anode electrode 410 may have a flat top surface.

The bank 500 is formed on the overcoat layer 250. The bank 500 may be a defining layer defining the light emitting part of the pixel PX. The bank 500 is configured to cover a portion of the edge of the anode electrode 410, and the exposed portion of the anode electrode 410 which is not covered by the bank 500 may be defined as the light emitting part of the pixel PX. In the light emitting part, the anode electrode 410, the light emitting element 1, and the cathode electrode 420 are stacked to be in direct contact with each other.

In the aspect, the light emitting part defined by the bank 500 may have a size corresponding to the number of light emitting elements 1 to be disposed in the light emitting part. For example, according to the illustrated aspects, as for the light emitting diode LD, two light emitting elements 1 are disposed in one light emitting part. However, the aspect of the present disclosure is not limited thereto.

In addition, such a light emitting part may have a shape corresponding to the light emitting elements 1. For example, when the light emitting element 1 is spherical, the light emitting part may have a shape in which one or more circles are disposed adjacently to each other as illustrated in FIG. 7A. Alternatively, when the light emitting element 1 is elliptical, the light emitting part may have a shape in which one or more ellipses are disposed adjacently to each other. In the aspect, each of the circular or elliptical shapes of the light emitting part may correspond to one light emitting element 1.

In the aspect, the thickness of the bank 500 may be determined by corresponding to the diameter of the light emitting element 1. For example, the thickness of the bank 500 may be smaller than the diameter of the light emitting element 1. For example, the thickness of the bank 500 may be about a half of the diameter of the light emitting element 1. However, the aspect of the present disclosure is not limited thereto.

Figure 7B:
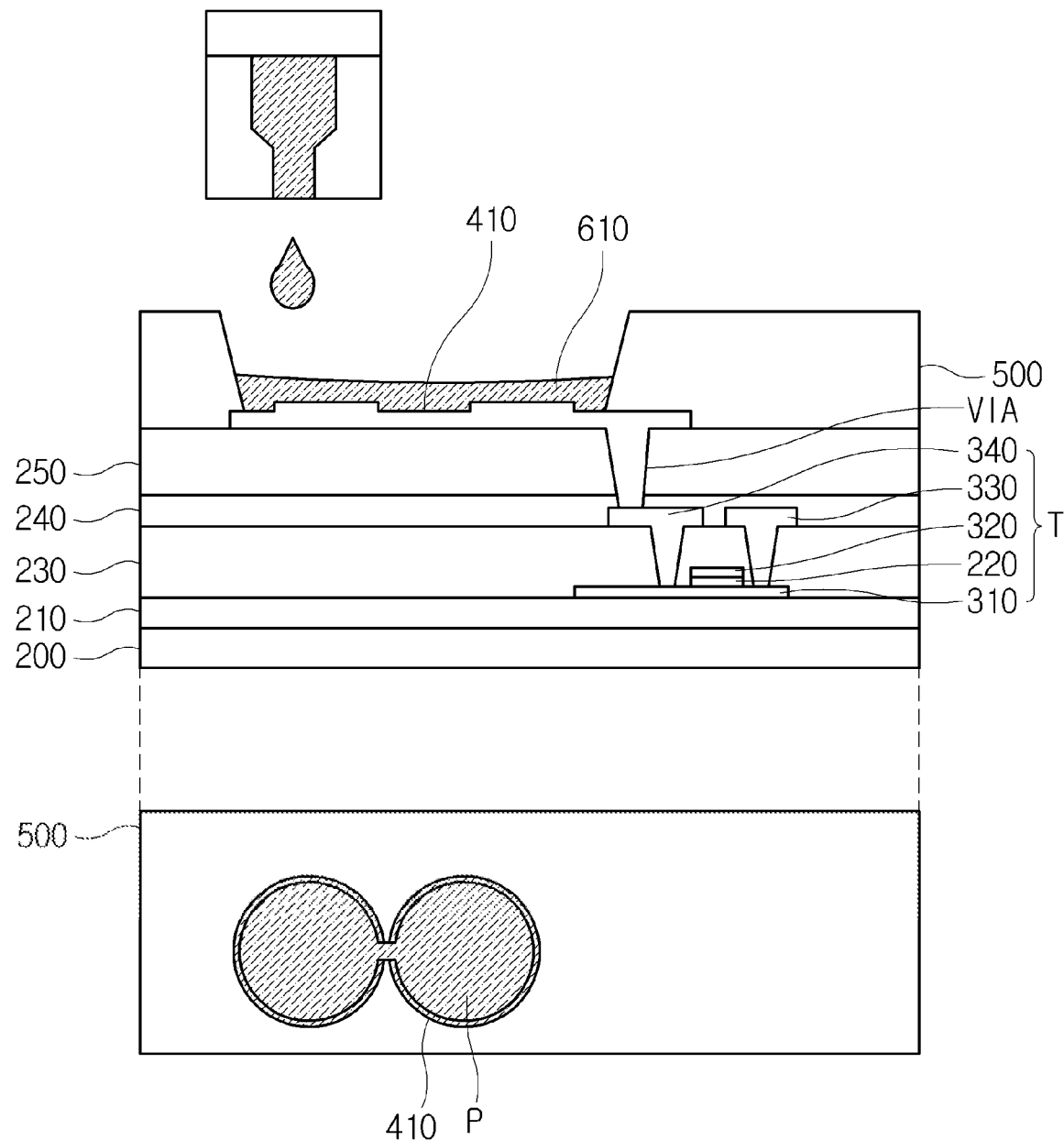

The drawing illustrated at the upper end of FIG. 7B is a sectional view of a portion of the display panel 50 illustrated in FIG. 7A, and the drawing illustrated at the lower end of FIG. 7B is a top plan view of a portion corresponding to the sectional view. Referring to FIG. 7B, adhesive 610 may be applied on the anode electrode 410. The adhesive 610 is conductive and, for example, may be made of Ag paste. In the aspect, the adhesive 610 may be selectively applied into the light emitting part by the inkjet device.

Figure 7C:
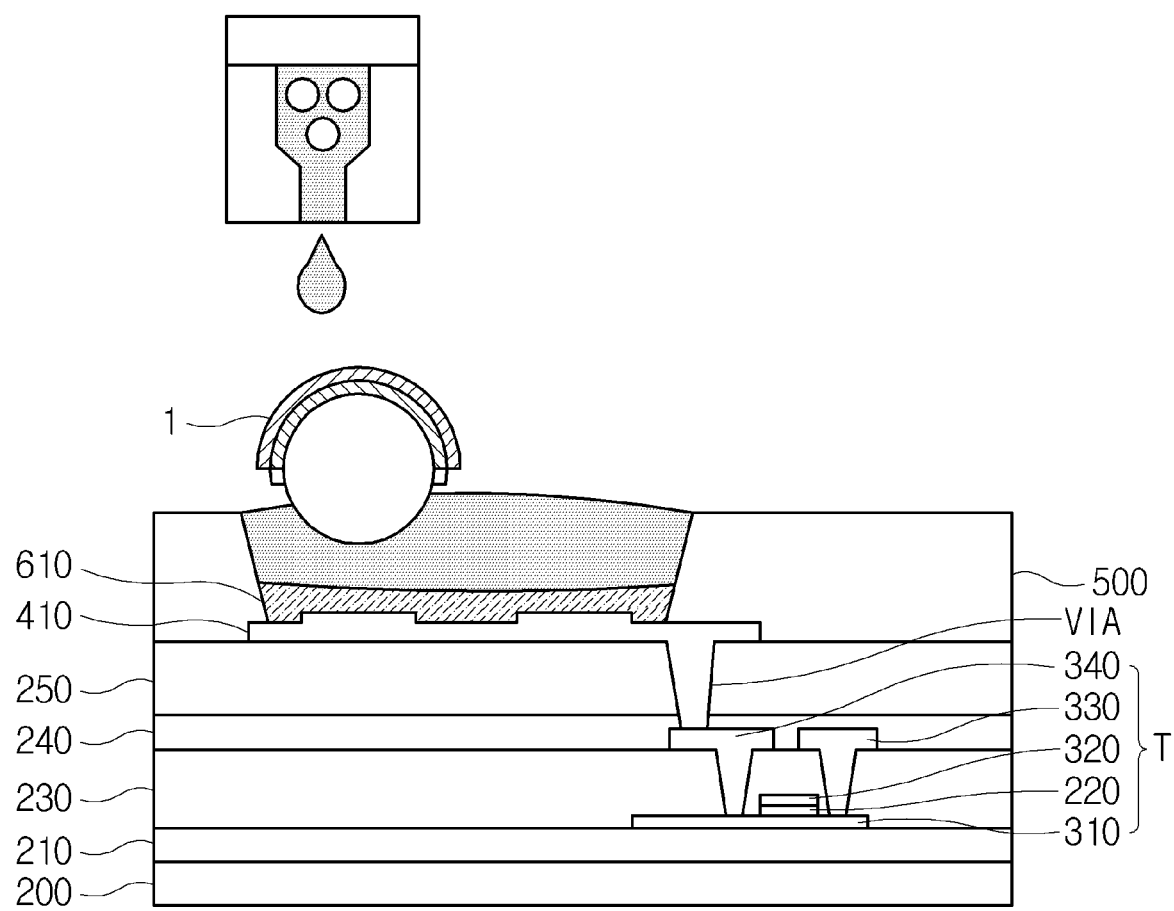

Next, as illustrated in FIG. 7C, the light emitting element 1 may be disposed on the anode electrode 410 on which the adhesive 610 is applied. In order to dispose the light emitting element 1, the solution in which the light emitting element 1 is immersed in solvent may be prepared. As illustrated in FIG. 7C, the solution may be selectively jetted into the light emitting part by the inkjet device. In the aspect, the nozzle of the inkjet device can jet the solution as the nozzle moves along a pixel row.

Figure 7D:
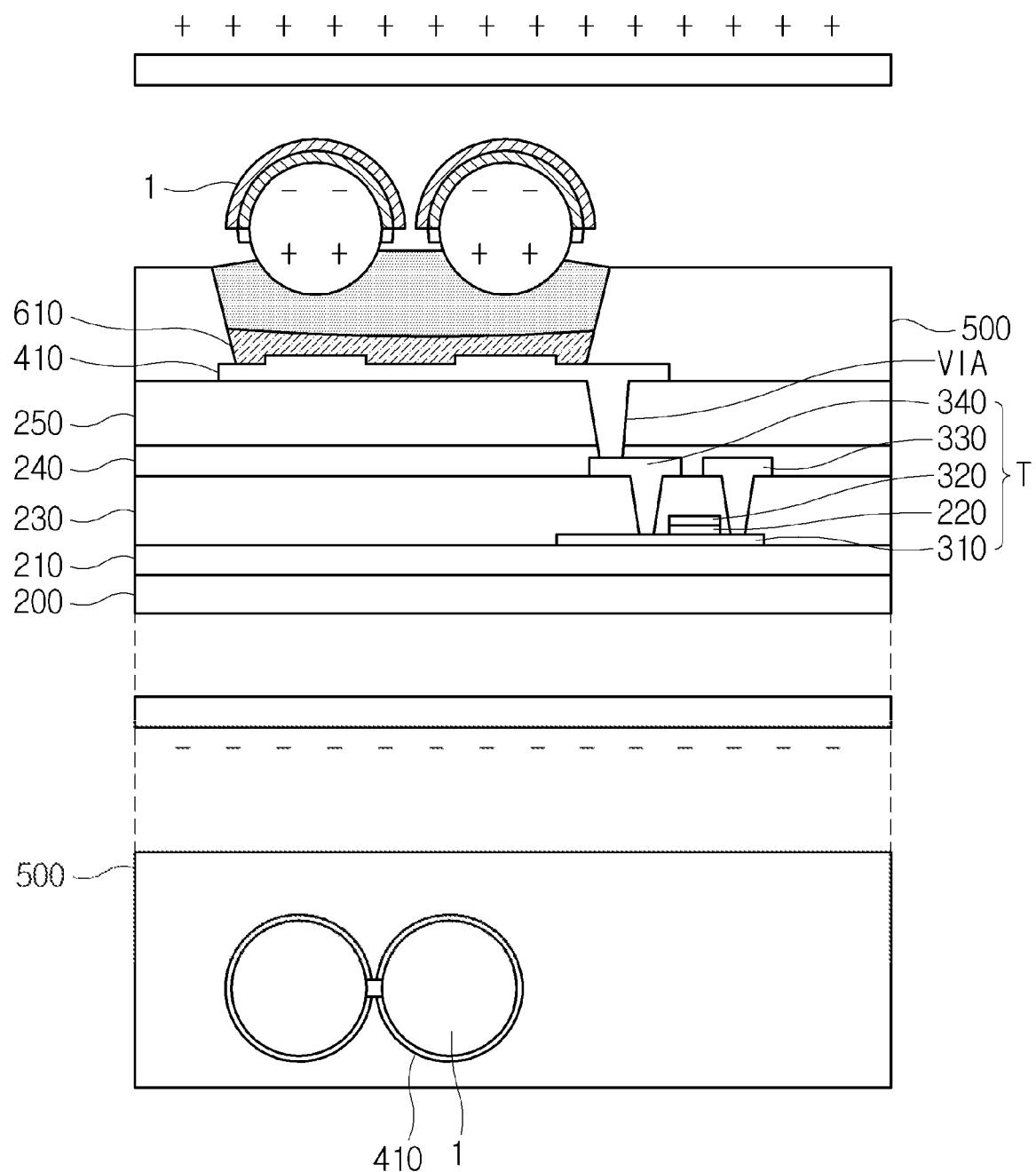
Figure 7E:
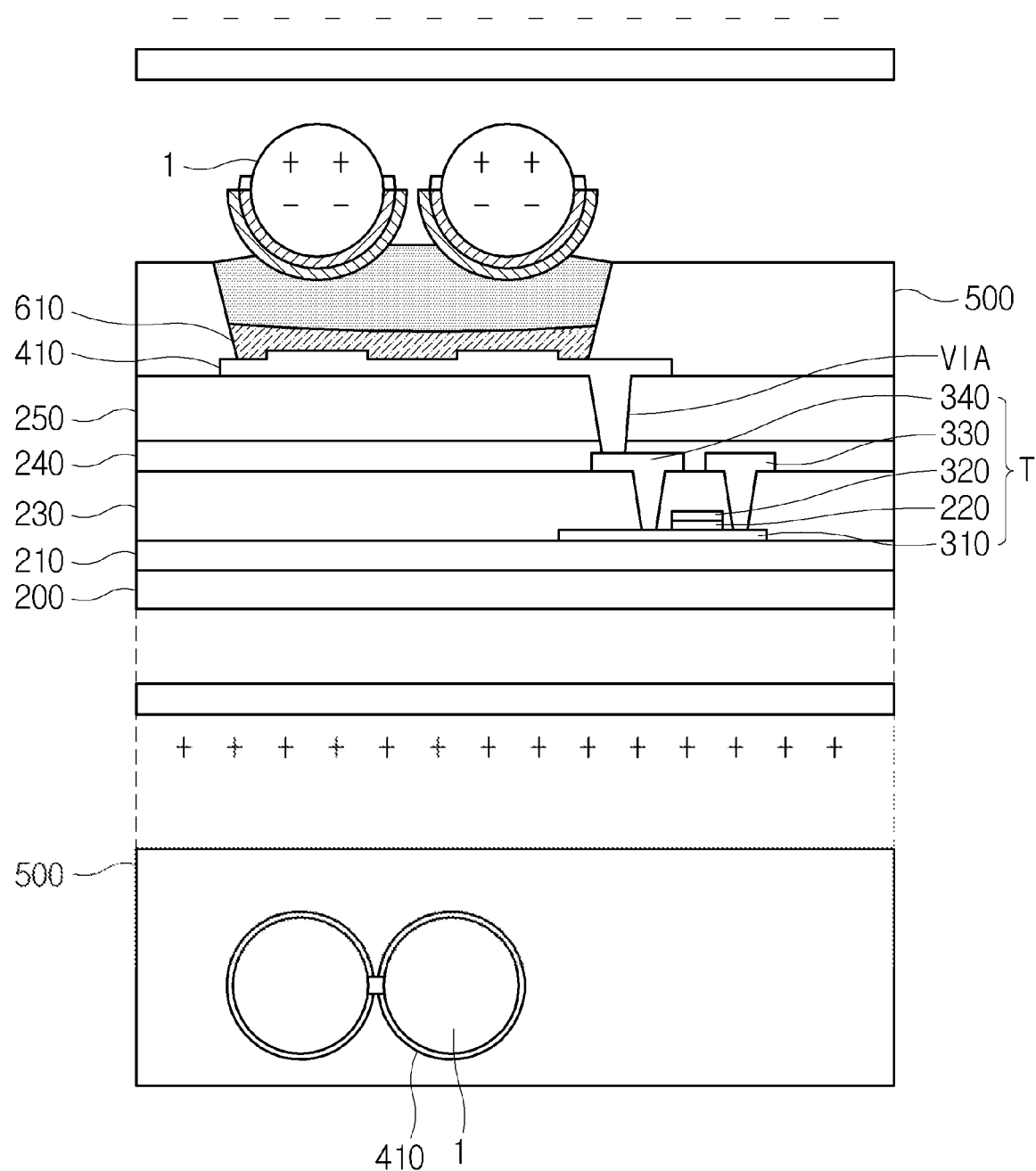

The drawings illustrated at the upper ends of FIG. 7D and FIG. 7E are sectional views of a portion of the display panel 50 illustrated in FIG. 7A, and the drawings illustrated at the lower ends of FIG. 7D and FIG. 7E are top plan views of portions corresponding to the sectional views, respectively. FIGS. 7D and 7E illustrate states after the jetting of the solution. In the light emitting part surrounded by the bank, the light emitting element 1 is immersed in the solvent. In the aspect, an electric field is formed in a surrounding area of the substrate 200 at which the light emitting element 1 is disposed such that the rotation direction of the light emitting element 1 can be controlled.

For example, as illustrated in FIG. 7D, when the electrode of the positive electric field is disposed at the upper side of the plate 100 and the electrode of the negative electric field is disposed at the lower side of the plate 100, the conductive ball 2 may be rotated such that the conductive ball 2 has the portion of a negative polarity located at an upper portion thereof and has the portion of a positive polarity located at a lower portion thereof. Contrarily, as illustrated in FIG. 7E, when the electrode of the negative electric field is disposed at the upper side of the plate 100 and the electrode of the positive electric field is disposed at the lower side of the plate 100, the conductive ball 2 may be rotated such that the conductive ball 2 has the portion of a positive polarity located at an upper portion thereof and has the portion of a negative polarity located at a lower portion thereof.

According to such a control of the rotation direction of the light emitting element 1, the display panel 50 may operate in a top light-emitting mode or in a bottom light-emitting mode. When the display panel 50 is manufactured in the top light-emitting mode, as illustrated in FIG. 7D, the rotation direction of the light emitting element 1 can be controlled such that a portion at which the light emitting layer 430 and the metal layer 3 are stacked on each other faces the upper side of the substrate 200. In this case, in the surface of the conductive ball 2, a portion which is not covered by the light emitting layer 430, the metal layer 3, and the insulating layer 4 may face the lower side of the substrate 200. Contrarily, when the display panel 50 is manufactured in the bottom light-emitting mode, as illustrated in FIG. 7E, the rotation direction of the light emitting element 1 can be controlled such that a portion at which the light emitting layer 430 and the metal layer 3 are stacked on each other faces the lower side of the substrate 200. In this case, a portion which is covered by the light emitting layer 430, the metal layer 3, and the insulating layer 4 may face the lower side of the substrate. The drawing illustrated in the upper end of FIG. 7E is the sectional view of a portion of the display panel 50 illustrated in FIG. 7A, and the drawing illustrated at the lower end of FIG. 7E is a top plan view of a portion corresponding to the sectional view.

When the solution is dried, the solvent evaporates and only the light emitting element 1 remains in the light emitting part. In this case, the light emitting element 1 may be in contact with the anode electrode 410. The light emitting element 1 may be securely fixed on the anode electrode 410 by the adhesive 610.

According to the rotation direction of the light emitting element 1, the metal layer 3 or the exposed surface of the conductive ball 2 may be in contact with the anode electrode 410 to be electrically connected with each other. In this case, each of the light emitting elements 1 may be in contact with the protruding part P of the anode electrode 410. The shape and size of the light emitting part defined by the bank 500 are determined by corresponding to the shape and size of the light emitting element 1, so the light emitting element 1 can be correctly aligned in a proper position, and as a result, can be disposed on the protruding part P of the anode electrode 410.

However, the aspect of the present disclosure is not limited thereto. That is, in other aspects, the upper surface of the anode electrode 410 may be formed to be flat, and the light emitting elements 1 may be disposed at random intervals in the light emitting part.

Figure 7F:
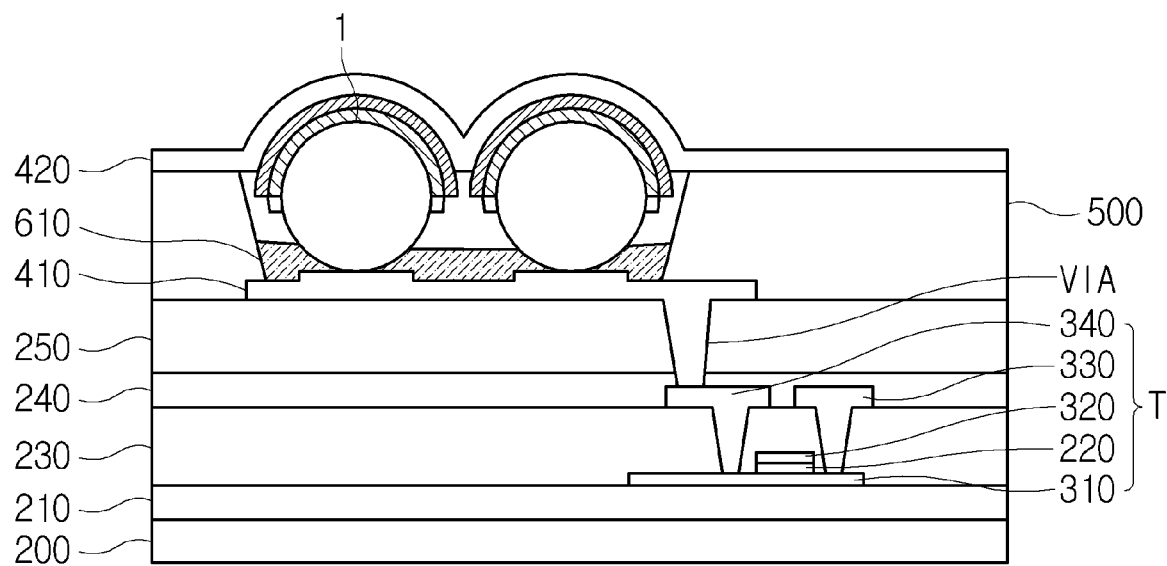
Figure 7G:
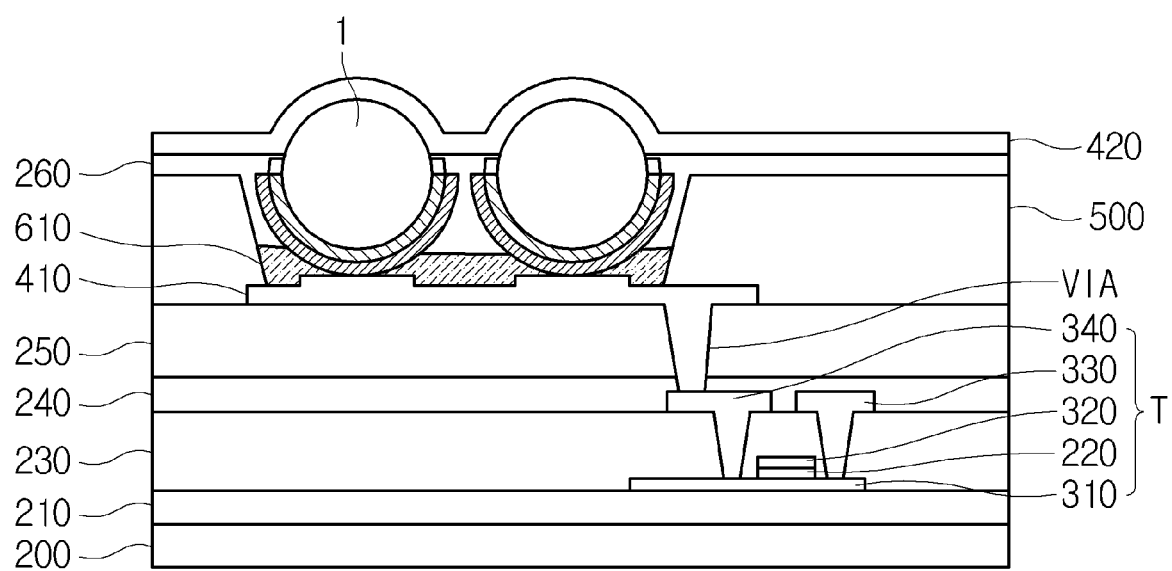

Next, as illustrated in FIGS. 7F and 7G, the cathode electrode 420 may be formed on the entire surface of the display panel 50. That is, the cathode electrode 420 may be configured to cover the light emitting element 1 and the bank 500. According to the rotation direction of the light emitting element 1, the cathode electrode 420 may be in contact with the metal layer 3 or exposed surface of the conductive ball 2 of the light emitting element 1 to be electrically connected with each other.

In the display panel 50 manufactured as described above, the anode electrode 410, the light emitting element 1, and the cathode electrode 420 constitute the light emitting diode LD. As illustrated in FIG. 7F, when the light emitting layer 430 of the light emitting element 1 faces the upper side of the display panel 50, the display panel 50 can operate in the top light-emitting mode. Contrarily, as illustrated in FIG. 7G, when the light emitting layer 430 of the light emitting element 1 faces the lower side of the display panel 50, the display panel 50 can operate in the bottom light-emitting mode.

When the display panel 50 is implemented in the bottom light-emitting mode, a buffer layer 260 may be placed between the light emitting element 1 and the cathode electrode 420. That is, before the cathode electrode 420 is formed, the buffer layer 260 may be formed on the entire surface of the display panel 50. Such a buffer layer 260 holds the light emitting element 1 in a required position and can prevent a short circuit between the cathode electrode 420 and the metal layer 3.

FIGS. 8A to 8D are views illustrating a manufacturing method of a display device according to another aspect.

Except for the jetting of only the light emitting element 1 which is not immersed in the solvent in the solution process, the aspect of FIGS. 8A to 8D is generally similar to the aspect described with reference to FIG. 7A to FIG. 7G, and the overlapping detailed description will be omitted.

Figure 8A:
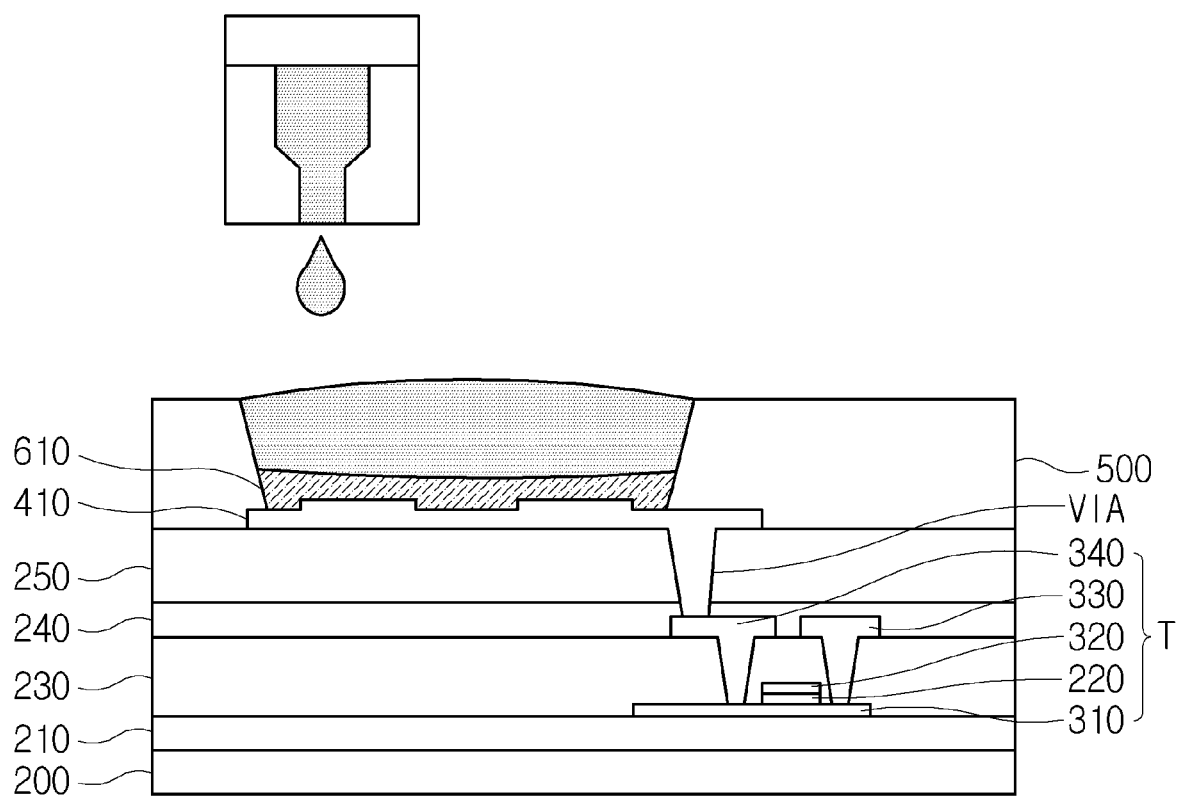
FIGS. 8A to 8D are views illustrating a manufacturing method of a display device according to another aspect.
Figure 8B:
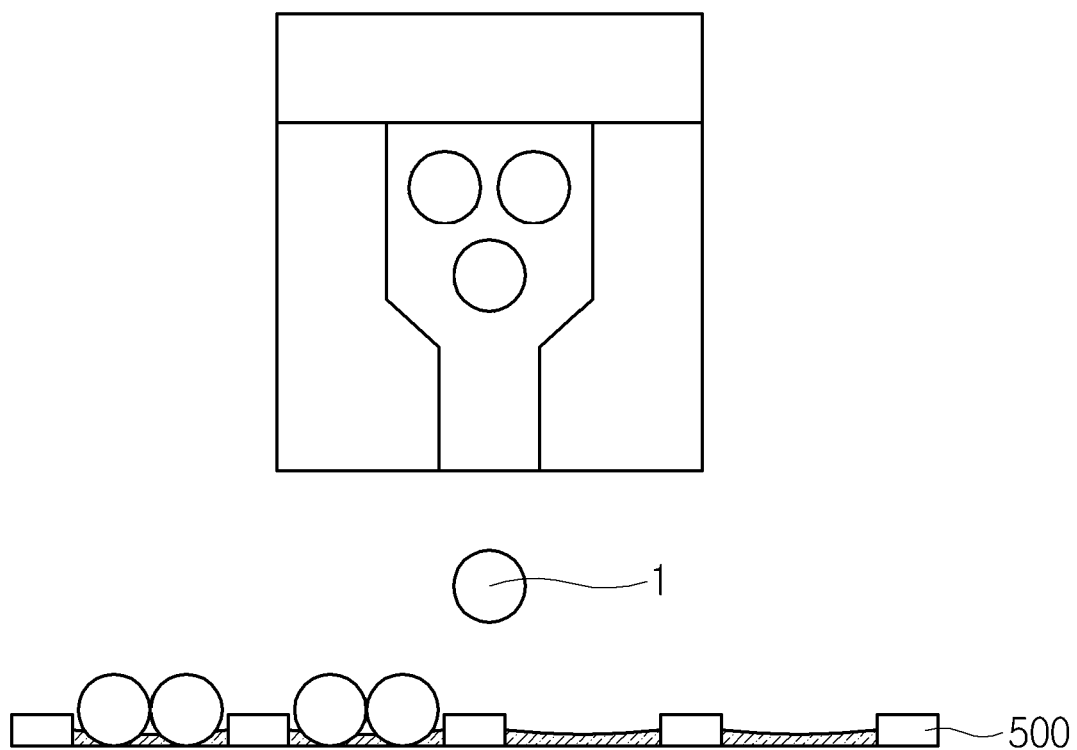

First, referring to FIG. 8A, the back plate on which at least one circuit element for driving the light emitting diode LD is disposed may be provided on the substrate 200. The light emitting diode layer may be formed on the back plate. The light emitting diode layer includes light emitting diodes LD, wherein each of the light emitting diodes LD includes the anode electrode 410, the light emitting element 1, and the cathode electrode 420.

Next, the mixed solution of the adhesive 610 and the solvent with each other may be applied on the anode electrode 410. The adhesive 610 is conductive and, for example, may be made of Ag paste. In the aspect, the mixed solution may be selectively applied into the light emitting part by the inkjet device. Next, when the solvent evaporates, only the adhesive 610 may be applied to the inside of the light emitting part.

Figure 8C:
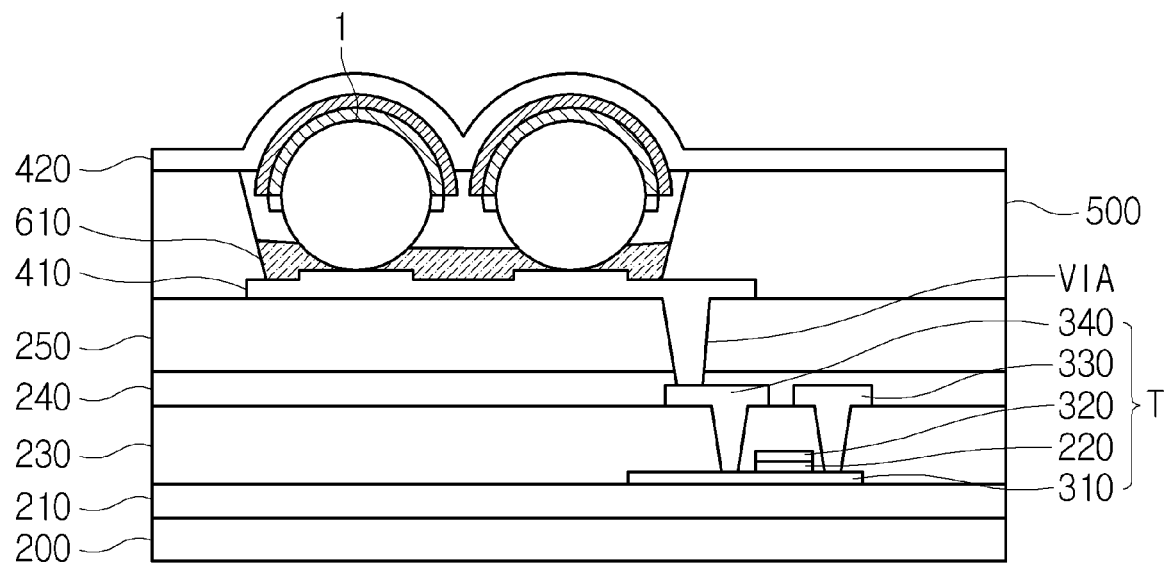

Next, as illustrated in FIG. 8C, the light emitting element 1 may be disposed on the anode electrode 410 on which the adhesive 610 is applied. The light emitting element 1 may be selectively jetted into the light emitting part by the inkjet device. Unlike the aspect of FIG. 7B, in the present aspect, only the light emitting element 1 which is not immersed in the solvent is jetted into the light emitting part. When the light emitting element 1 is jetted at a predetermined speed from the nozzle, a distance between the end part of the nozzle and the bank 500 may correspond to about ¾ of the diameter of the light emitting element 1. In this case, the light emitting element 1 may be correctly disposed into the light emitting part by a step caused by the bank 500 and the upper surface of the anode electrode 410. However, the present aspect is not limited thereto.

After the light emitting element 1 is jetted, the rotation direction of the light emitting element 1 may be controlled as described with reference to FIG. 7D and FIG. 7E.

Figure 8D:
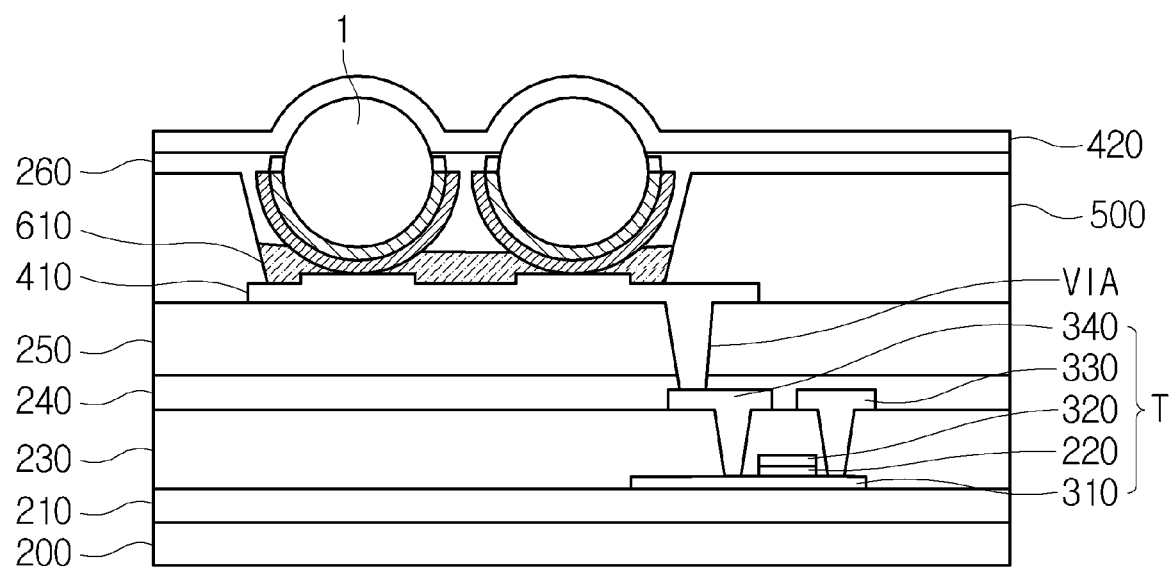

Next, as illustrated in FIGS. 8C and 8D, the cathode electrode 420 may be formed on the entire surface of the display panel 50. That is, the cathode electrode 420 may be configured to cover the light emitting element 1 and the bank 500. According to the rotation direction of the light emitting element 1, the cathode electrode 420 may be in contact with the metal layer 3 or exposed surface of the conductive ball 2 of the light emitting element 1 to be electrically connected with each other.

Figure 9:
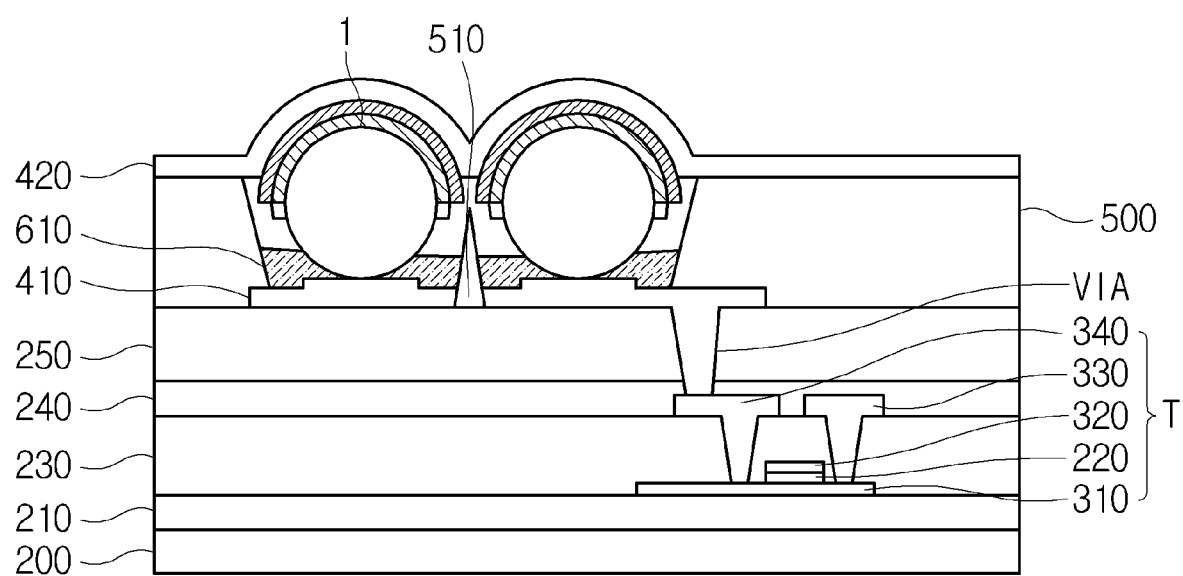
FIG. 9 is a view illustrating a display device according to still another aspect.

FIG. 9 is a view illustrating a display device according to still another aspect.

Referring to FIG. 9, the display panel 50 according to the aspect may further include an auxiliary bank 510 which divides the light emitting part into a plurality of sections. The light emitting part may be divided into the plurality of sections by the auxiliary bank 510. Each of the sections may have size and shape corresponding to one light emitting element 1. In addition, in the aspect, the protruding part P of the anode electrode 410 may be disposed inside each of the sections.

In such an aspect, when the solution is applied to the inside of the light emitting part, the light emitting elements 1 located in the solution are captured and fixed in the sections, respectively, divided by the auxiliary bank 510. That is, the auxiliary bank 510 is disposed between the light emitting elements 1. Accordingly, the light emitting element 1 may be correctly aligned and disposed in a required position.

Although the aspects of the present disclosure have been described above with reference to the accompanying drawings, it will be understood that the technical configuration of the display device of the present disclosure may be embodied in other specific forms by those skilled in the art to which the present disclosure pertains without changing the technical spirit or essential features of the present disclosure. Therefore, it should be understood that the aspects described above are illustrative in all respects and not restrictive. In addition, the scope of the present disclosure is indicated by the claims to be described later rather than by the above detailed description. In addition, all changes or modifications derived from the meaning and scope of the claims and their equivalent concepts should be construed as being included in the scope of the present disclosure.

What is claimed is:

1. A light emitting element comprising:
    a spherical conductive ball;
    a light emitting layer in contact with a surface of the spherical conductive ball and covering a portion of a surface along a shape of the surface of the spherical conductive ball;
    a metal layer formed on the light emitting layer and not directly in contact with the surface of the conductive ball; and
    an insulating layer covering at least a portion of a remaining portion of the surface along the shape of the surface of the spherical conductive ball,
    wherein the light emitting layer is disposed between the spherical conductive ball and the metal layer and directly in contact with the spherical conductive ball and the metal layer.

2. The light emitting element of claim 1, wherein the spherical conductive ball has a circular or elliptical cross-section.

3. The light emitting element of claim 1, wherein the spherical conductive ball is made of at least one of aluminum, copper, and a transparent conductive material, and
    wherein the metal layer is made of at least one of the aluminum and the transparent conductive material.

4. The light emitting element of claim 1, wherein the conductive ball has one of a positive polarity and a negative polarity in one portion and has another one of the positive polarity and the negative polarity in a remaining portion.

5. The light emitting element of claim 4, wherein the light emitting layer and the metal layer cover the one portion of the spherical conductive ball, and
    wherein the insulating layer covers the remaining portion of the spherical conductive ball by having a shape of a band.

6. A display device comprising:
    a substrate on which a circuit element layer comprising at least one circuit element is disposed;
    an anode electrode formed on the circuit element layer;
    a bank configured to cover an edge of the anode electrode and to define a light emitting part;
    at least one light emitting element disposed on the anode electrode by corresponding to the light emitting part; and
    a cathode electrode covering the at least one light emitting element and the bank, wherein the light emitting element comprises:
a spherical conductive ball;
a light emitting layer directly in contact with a surface of the spherical conductive ball and covering a portion of a surface along a shape of the surface of the conductive ball;
a metal layer formed on the light emitting layer and not in contact with the surface of the conductive ball; and
an insulating layer covering at least a portion of a remaining portion of the surface along the shape of the surface of the conductive ball.

7. The display device of claim 6, wherein the conductive ball has a circular or elliptical cross-section.

8. The display device of claim 7, wherein the light emitting part has a shape in which one or more circles or ellipses are disposed adjacently to each other, and
wherein the circle or ellipse correspond to a shape and a diameter of the light emitting element.

9. The display device of claim 7, wherein the anode electrode comprises at least one protruding part corresponding the at least one light emitting element.

10. The display device of claim 7, wherein the bank divides the light emitting part into a plurality of sections, and
wherein the display device further comprises an auxiliary bank disposed between each of the light emitting elements.

* * * * *